United States Patent
Sakamoto et al.

(10) Patent No.: US 6,341,088 B2
(45) Date of Patent: *Jan. 22, 2002

(54) DYNAMIC RANDOM ACCESS MEMORY IN SWITCH MOSFETS BETWEEN SENSE AMPLIFIERS AND BIT LINES

(75) Inventors: Tatsuya Sakamoto, Higashimurayama; Osamu Nagashima, Hamura; Riichiro Takemura, Kokobunji, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/750,038

(22) Filed: Dec. 29, 2000

Related U.S. Application Data

(63) Continuation of application No. 09/471,504, filed on Dec. 23, 1999, now Pat. No. 6,212,110.

(30) Foreign Application Priority Data

Dec. 24, 1998 (JP) .......................................... 10-365887

(51) Int. Cl.[7] ................................................. G11C 7/00
(52) U.S. Cl. ........................ 365/190; 365/207; 365/63
(58) Field of Search ................................. 365/190, 205, 365/207, 208, 63

(56) References Cited

U.S. PATENT DOCUMENTS

| | | |
|---|---|---|
| 5,262,999 A | 11/1993 | Etoh et al. |
| 5,265,058 A | 11/1993 | Yamauchi |
| 5,636,158 A * | 6/1997 | Kato et al. .................... 365/63 |
| 5,875,141 A | 1/1999 | Shirley et al. |
| 5,959,913 A | 9/1999 | Raar |
| 6,084,816 A | 7/2000 | Okamura |
| 6,118,708 A | 9/2000 | Yoshida et al. |
| 6,140,805 A * | 10/2000 | Kaneko et al. .............. 323/280 |
| 6,212,110 B1 * | 4/2001 | Sakamoto et al. .......... 365/190 |

FOREIGN PATENT DOCUMENTS

| | | |
|---|---|---|
| JP | 6473596 | 3/1989 |
| JP | 4-167293 | 6/1992 |
| JP | 5-62463 | 3/1993 |
| JP | 8-106781 | 4/1996 |
| JP | 10241367 | 9/1998 |
| JP | 11086549 | 3/1999 |

* cited by examiner

*Primary Examiner*—Son L. Mai
*Assistant Examiner*—Gene N. Auduong
(74) *Attorney, Agent, or Firm*—Antonelli, Terry, Stout & Kraus, LLP

(57) ABSTRACT

Switch MOSFETs are interposed between a sense amplifier disposed in a dynamic RAM and complementary bit lines. After signal voltages are read out by selecting operations of word lines from a plurality of dynamic memory cells selected, to the plurality of pairs of complementary bit lines in accordance with individual storage informations, the switch control signal of the switch MOSFETs is changed from a select level to a predetermined intermediate level. This turns on the switch MOSFETs thereby setting sense nodes to one level in accordance with the amplifying operations of the sense amplifier. An amplification signal generated by the amplifying operation is transmitted through the column select circuit to input/output lines in response to the column select signal, and the switch control signal is returned to the select level in response to the selecting operation of the column select circuit.

5 Claims, 13 Drawing Sheets

DYNAMIC RANDOM ACCESS MEMORY IN SWITCH MOSFETS BETWEEN SENSE AMPLIFIERS AND BIT LINES

CROSS-REFERENCE TO RELATED APPLICATION

This application is a continuation of Ser. No. 09/471,504, filed Dec. 23, 1999 now U.S. Pat. No. 6,212,110 the entire disclosure of which is hereby incorporated by reference.

BACKGROUND OF THE INVENTION

The present invention relates to a semiconductor memory device and, mainly, to a technique which is effective when utilized in a dynamic RAM (Random Access Memory) including switch MOSFETS between a sense amplifier and bit lines.

The dynamic RAM, which is intended to raise the speed of the sense amplifier by turning OFF the selected side of a shared select MOSFET temporarily to lighten the load on the sense amplifier, has been disclosed in Japanese Patent Laid-Opens Nos. 64-73596, 5-62463 and 8-106781. In Japanese Patent Laid-Open No. 4-167293, on the other hand, there is disclosed a dynamic RAM. In this dynamic RAM, switch MOSFETs, which are interposed between the input/output nodes of the sense amplifier and complementary bit lines, are first set to the unselect level at the time of starting the amplification of the sense amplifier, so that the sense amplifier and the complementary bit lines are isolated to start the amplifying operations. After a column selection, the gate voltage of the switch MOSFETs is set to an intermediate potential to perform the operations in parallel to output one of the sense amplifier amplification signals to the IO lines and to restore the other amplification signal in the bit lines. After this, the gate voltage of the switch MOSFETs is returned to the select level so that the one amplification signal is re-stored through the bit lines in the memory cells.

Here, the terminlogy "MOS(Metal Oxide Semiconductor) FET" includes a "MIS (Metal Insulated Semiconductor)FET according to general recognition, and widely refers to a field effect transistor.

SUMMARY OF THE INVENTION

As in the dynamic RAM disclosed in Japanese Patent Laid-Opens Nos. 64-73596, 5-62463 and 8-106781, before the amplification start of the sense amplifier, the shared select MOSFETs are turned OFF to isolate the complementary bit lines and the sense nodes of the sense amplifier. The sense nodes, even if at a full amplification level state, are lowered at their level, when the shared select MOSFETs are returned again to the ON state. By the charge share between the read charge from the memory cells held in a relatively high parasitic capacity of the bit lines and the charge in the sense nodes, the potential of the sense nodes drops so that the signal amplitude is temporarily reduced, as clarified by our investigations. Alternatively, even when the sense nodes are connected with the data output lines by the column selecting operation, the signal amplitude of the sense nodes is also temporarily reduced, as clarified by our investigations, by the charge share between the precharge charge held in the parasitic capacity of the data output lines and the charge in the sense nodes. As a result, in the column selecting operation, the column selecting operation has to take a relatively long time for transmitting the signal of the sense nodes to the data input/output lines, and this long time causes an obstruction to the high speed, as also clarified by our investigations.

In the Japanese Patent Laid-Open No. 4-167293, the gates of the switch MOSFETs are set to the intermediate potential to cause the sense amplifier to effect outputting at the low level to the I/O lines. In parallel with this, the re-storage (or reloading) of the data is effected in the bit lines on the high level side. As well known in the art, however, the memory cells store the binary information. Even if the re-storage of the data on the high level side is exclusively accelerated, as described above, the effect in view of the overall memory access is questionable, as clarified by our investigations, considering that the data re-storage on the low level side is not performed before the switch MOSFETs are returned to the ON state. On the other hand, that effect involves a problem in that the timing control at the level is complicated, as clarified by our investigations, considering that the gate voltage to be fed to the gate of one switch MOSFET is changed between the unselect level—the select level—the intermediate level—the unselect level within a short time period from just before the start of the sense operation to the restoring operation of the bit lines, so that the provision of the switch MOSFETs makes no sense if the transfer from the select level to the intermediate level is not made before the sense output grows sufficient, and the elements have a process dispersion. It has been further clarified by our investigations that the change from the intermediate level to the unselect level raises an obstruction to the high speed of the re-storage operations.

An object of the invention is to provide a semiconductor memory device which has realized a stable amplifying operation and a high speed in a sense amplifier with a simple construction. The foregoing and other objects and novel features of the invention will become apparent from the description to be made with reference to the accompanying drawings.

Representative aspects of the invention to be disclosed herein will be briefly summarized in the following. Specifically, switch MOSFETs are interposed between a sense amplifier disposed in a dynamic RAM and complementary bit lines. After signal voltages have been read out by the selecting operations of said word lines, from a plurality of selected dynamic memory cells, to the plurality of pairs of complementary bit lines in accordance with their individual storage informations, the switch control signal of said switch MOSFETs is changed from a select level to the intermediate potential having: (a) an OFF state or a relatively high ON resistance for the signal voltage read out to said complementary bit lines; (b) an ON state with a relatively low ON resistance for a potential at which the sense nodes are set to one level by the amplifying operation of the sense amplifier; and (c) an OFF state at a potential of the other level. The sense amplifier is fed with an operating voltage to start the amplifying operation in response to the change in said switch control signal; an amplification signal generated by said amplifying operation is transmitted through the column select circuit to said input/output lines in response to the column select signal; and said switch control signal is returned to the select level in response to the selecting operation of said column select circuit.

With the construction thus far described, in the amplifying operation of the sense amplifier, one of the sense nodes is connected with the bit line so that a high signal charge can be established by the parasitic capacity on the bit lines. In the column selecting operation, therefore, a high read signal can be outputted to the data input/output lines thereby to effect the high speed of the sense output operation.

DETAILED DESCRIPTION OF THE INVENTION

Figure 1:
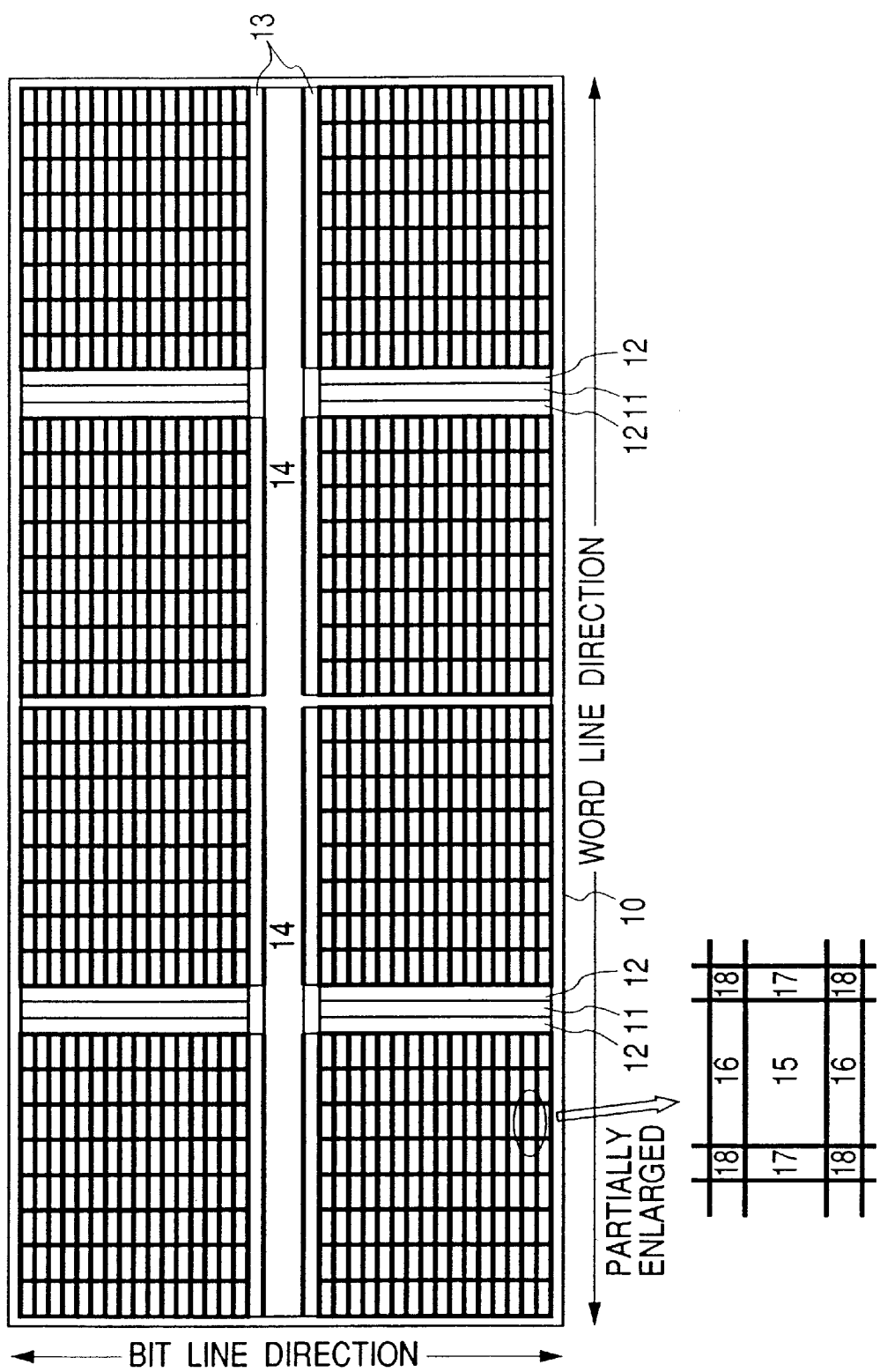
FIG. 1 is a schematic layout diagram showing one embodiment of the dynamic RAM to which the invention is applied.

FIG. 1 is a schematic layout diagram showing one embodiment of a dynamic RAM to which the invention is applied. In FIG. 1, of the individual circuit blocks of the dynamic RAM to which the invention is applied, a main portion is clearly shown and formed over one semiconductor substrate of single crystalline silicon by the well-known technique for manufacturing a semiconductor integrated circuit.

In this embodiment, the memory array is divided into four parts, although the invention is not especially limited thereto. At a central portion 14 in the longitudinal direction of the semiconductor chip, there are provided an input/output interface circuit including an address input circuit, a data input/output circuit and a bonding pad array, a power supply circuit including a voltage step-down circuit, and so on. On the two sides, contacting the memory arrays, of the central portion 14, there are arranged column decoder regions 13.

Each of the four memory arrays, as divided into two left and right arrays and into two upper and lower arrays with respect to the longitudinal direction of the semiconductor chip, as described above, is made to form one memory bank. In each of the memory arrays, a main row decoder region 11 is provided at an up-and-down center portion with respect to the longitudinal direction. Above and below this main row decoder region, there are formed main word driver regions 12 which individually drive the main word lines of the memory array which has been divided into the upper and lower array The memory cell array.(or sub array) 15 is formed, as shown in an enlarged view, such that it is surrounded by sense amplifier regions 16 and sub word driver regions 17. The sense amplifier region and the sub word driver region provides an intersection region (or cross area) 18 at their intersecting portion. A sense amplifier, as provided in the sense amplifier region 16, is constructed by the shared sense method. On the left and right sides around the sense amplifier other than those arranged on the two ends of the memory cell array, there are provided complementary bit lines, which are selectively connected with the complementary bit lines of the left or right memory cell array.

The memory arrays, as divided into four left and right arrays with respect to the longitudinal direction of the semiconductor chip, as described above, are arranged in two pairs. At the central portions of the two memory arrays thus arranged in the pairs, there are arranged the main row decoder region 11 and main word drivers 12. These main word drivers 12 generate a select signal for selecting main word lines, which are extended through one of the memory arrays. On the other hand, the main word drivers 12 are provided with sub word selecting drivers, which are extended in parallel with the main word lines to generate a sub word selecting line signal, as will be described hereinafter.

One memory cell array (or sub array)15 as shown in the enlarged view, is provided with 256 sub word lines, although not shown, and 256 pairs of complementary bit lines (or data lines) perpendicular to the former, although the invention is not especially limited thereto. Alternatively, there are provided 512 sub word lines and 512 pairs of complementary bit lines perpendicular to the former. If the one memory array is provided, as shown, with sixteen memory cell arrays (or sub arrays) 15 in the bit line direction, the sub word lines are provided as a whole about 4K for the 256 construction and about 8K for the 512 construction. Since eight memory cell arrays are provided in the word line direction, the complementary bit lines are provided as a whole about 4K for the 256 construction and 8K for the 512 construction. Since these eight memory arrays are provided as a whole, the overall storage capacity is 8×2K×4K=64 Mbits or 8×4K×8K=256 Mbits.

The one memory array is divided into eight with respect to the main word line direction. For each memory cell array 15 thus divided, there is provided a sub word driver (or sub word line driver) 17. This sub word driver 17 is divided to have one eighth of the length of the main word lines to generate a select signal for selecting the sub word line extending in parallel with the former. In this embodiment, in order to reduce the number of main word lines, i.e., in order to widen the wiring pitch of the main word lines, four sub word lines are arranged with respect to one main word line in the complementary bit line direction, although the invention is not especially limited thereto. A sub word selecting driver is arranged to select one of the sub word lines which are thus divided into eight in the main word line direction and assigned every four in the complementary bit line direction. The sub word selecting driver generates a select signal for selecting one of the four sub word selecting lines extending in the array direction of the sub word drivers.

As described above, one memory array has the storage capacity of 4 Kbits or 8 Kbits with respect to the complementary bit line direction. If the memory cells as high as 4K or 8K are connected with one complementary bit line, however, the parasitic capacity of the complementary bit lines increases so that a signal level to be read cannot be obtained due to the small capacity ratio to an information storing capacitor. Therefore, the division is also made into sixteen with respect to the complementary bit line direction. Specifically, the complementary bit lines are divided into sixteen by the sense amplifiers 16, as indicated by thick black lines. Although the invention is not especially limited thereto, the sense amplifier 16 is constructed by the shared sense method, and the complementary bit lines are provided on the left and right of the sense amplifier 16, except for those which are arranged at the two ends of the memory array, so that the sense amplifier 16 is selectively connected with either the left or right complementary bit lines.

In order to retain the signal amount to be read out to the bit lines, the sub array may be constructed such that the number of memory cells to be connected therewith is set to 256 (excepting the redundancy cells) to make the number of divisions of bit lines more than that of word lines (or sub word lines). In the dynamic RAM of this case having a storage capacity of about 256 Mbits, each of quartered memory arrays has a storage capacity of 8K×8K=64 Mbits. As a result, the bit lines are divided into thirty two whereas the word lines are divided into sixteen, and the sub arrays are correspondingly provided.

Figure 2:
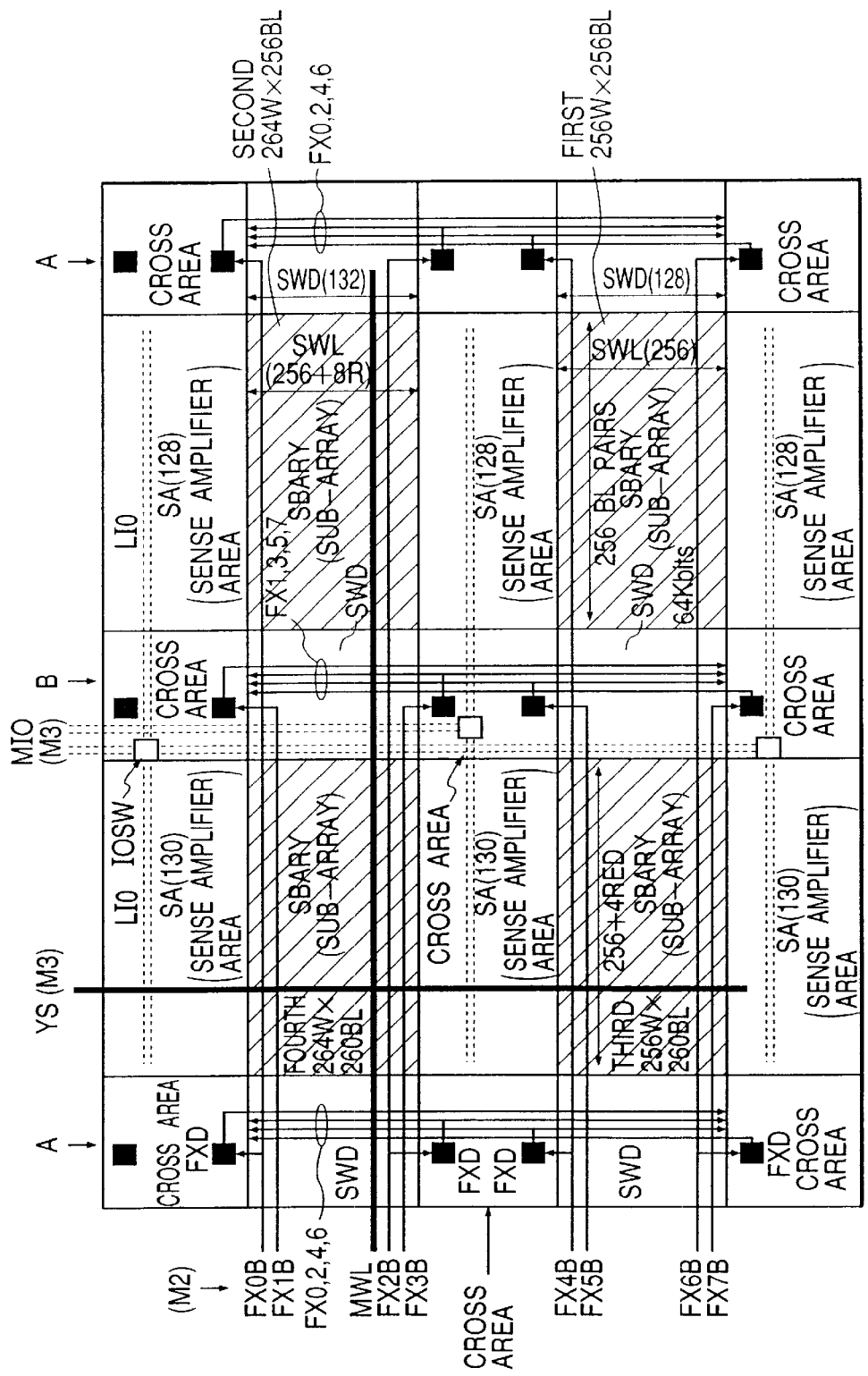
FIG. 2 is a schematic layout diagram showing one embodiment of the sub array and its peripheral circuit in the dynamic RAM according to the invention.
Figure 3:
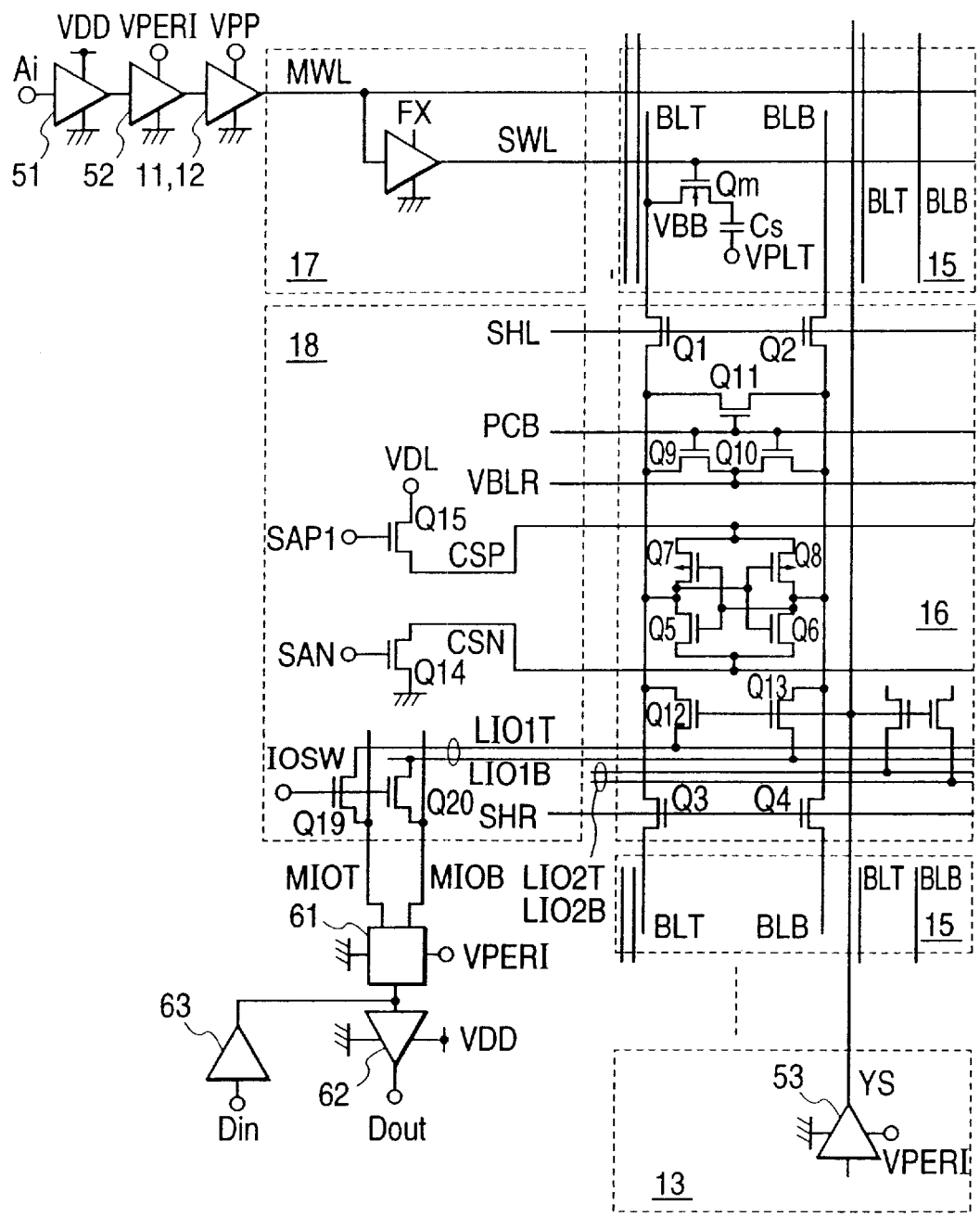
FIG. 3 is a circuit diagram of one simplified embodiment of the dynamic RAM according to the invention, showing the area around the sense amplifier portion thereof from the address input to the data output.

FIG. 2 is a schematic layout diagram showing one embodiment of the sub array and its peripheral circuit in the dynamic RAM according to the invention. In FIG. 3, the regions to have sub arrays SBARY are discriminated by hatching them from the sub word driver regions, the sense amplifier regions and the cross areas, as provided in the peripheries of the former.

The sub array SBARY is divided into the following four kinds in the example of the construction of 256×256. If the extending direction of the word lines is horizontal, more specifically, the first sub array SBARY, as located at the righthand lower position, is arranged with 256 sub word lines SWL, and the complementary bit lines are made up of 265 pairs. Therefore, 256 sub word drivers SWD corresponding to the 256 sub word lines SWL are divided into halves of 128 and arranged on the left and right sides of that sub array. In addition to the shared sense amplifier construction, 256 sense amplifiers SA, as provided to correspond to the 256 pairs of complementary bit lines BL, are alternately arranged by 128 above and below that sub array.

The second sub array SBARY, as located at the righthand upper position, is provided with eight preparatory (or redundancy) word lines in addition to the 256 normal sub word lines SWL, although the invention is not especially limited thereto, and the complementary bit lines are composed of 265 pairs. Therefore, the 264 sub word drivers SWD corresponding to the (256+8) sub word lines SWL are separately arranged with 132 on the left and right of that sub array. Like the above, the 128 sense amplifiers are arranged above and below. Specifically, the 128 pairs of complementary bit lines of the 265 pairs, as formed in the sub arrays SBARY arranged above and below on the right side, are commonly connected through a shared switch MOSFET with the sense amplifier SA interposed inbetween.

The third sub array SBARY, as located at the lefthand lower position, is constructed to have 256 sub word lines SWL as in the adjoining righthand sub array SBARY. Like above, the 128 sub word drivers are separately arranged. The 128 of the 256 sub word lines SWL of the sub arrays SBARY, as located at the lefthand and righthand lower positions, are commonly connected with the 128 sub word drivers SWD which are formed in the regions interposed inbetween. As described above, the sub array SBARY, as located at the lefthand lower position, is provided with four pairs of preparatory (or redundancy) bit lines 4RED in addition to the 265 pairs of normal complementary bit lines BL. Therefore, the 260 sense amplifiers SA corresponding to the 260 pairs of complementary bit lines BL are separately arranged with 130 above and below that sub array.

The fourth sub array SBARY, as located at the lefthand upper position, is provided, as in the adjoining righthand sub array SBARY, with 256 normal sub word lines SWL and eight preparatory sub word lines and, as in the adjoining lower sub array, with four pairs of preparatory bit lines in addition to 256 pairs of normal complementary bit lines. Therefore, the sub word drivers are separately arranged with 132 on the left and right sides, and the sense amplifiers SA are separately arranged with 130 above and below.

The main word lines MWL are so extended in the horizontal direction that one of them is exemplified. On the other hand, column selecting lines YS are so extended in the vertical direction that one of them is exemplified. The sub word lines SWL are arranged in parallel with the main word lines MWL, and the (not-shown) complementary bit lines BL are arranged in parallel with the column selecting lines YS.

For the four sub arrays, eight sub word selecting lines FX0B to FX7B are extended like the main word lines MWL through the four sets of (or eight) sub arrays. Moreover, the four sub word selecting lines FX0B to FX3B and the four sub word selecting lines FX4B to FX7B are extended separately over the upper and lower sub arrays. The reason why one set of sub word selecting lines FX0B to FX7B are thus assigned to the two sub arrays and extended over the sub arrays is to reduce the memory chip size.

Specifically, when the eight sub word selecting lines FX0B to FX7B are assigned to each sub array and are formed in the wiring channels over the sense amplifier area, the number of wiring channels necessary is as much as 8×32 =256 for the 32 sense amplifiers in the shorter side direction, as in the memory array of FIG. 1. In the foregoing embodiment, on the contrary, the wiring lines can be formed without any special dedicated regions by assigning the eight sub word selecting lines FX0B to FX7B commonly to the two upper and lower sub arrays and by arranging them over the sub arrays in parallel with the main word lines and in a mixed manner.

Intrinsically, one main word line is provided over the sub array for eight sub word lines, and the sub word selecting lines are demanded for selecting one of the eight sub word lines. Since one main word line MWL is formed for the eight sub word lines SWL which are formed according to the pitch of the memory cells, the main word lines MWL have a wide wiring pitch. It is, therefore, relatively easily effected by sacrificing the width of the wiring pitch slightly to form the sub word selecting lines between the main word lines MWL by making use of the same wiring layer as that of the main word lines MWL.

The sub word driver SWD of this embodiment adopts a construction to select one sub word line SWL by using a select signal, as fed through the sub word selecting lines FX0B and so on, and a select signal inverted from the former. Moreover, the sub word driver SWD adopts a construction to select the sub word lines SWL of the sub arrays arranged on its left and right sides. For the two sub arrays sharing the FX0B, therefore, the four sub word selecting lines are shared and fed to as many as 128×2=256 sub word drivers. In other words, noting the sub word selecting line FX0B, for the two sub arrays, the select signal has to be fed to as many as 256÷4=64 sub word drivers SWD.

If the first sub word selecting line FX0B is extended in parallel with the main word line MWL, there is provided a second sub word selecting line FX0 which is provided in the lefthand upper cross area, to feed the select signal to the sixty four sub word drivers arrayed on the upper and lower sides through the sub word selecting line driver FXD for receiving the select signal from the first sub word selecting line FX0B. This first sub word selecting line FX0B is extended in parallel with the main word lines MWL and the sub word lines SWL, whereas the second sub word selecting line is extended over the sub word driver region in parallel with the column selecting lines YS and the complementary bit lines BL perpendicular to the first sub word selecting line FX0B. Like the eight first sub word selecting lines FX0B to FX7B, the second sub word selecting lines FX0 to FX7 are divided into even lines FX0, 2, 4 and 6 and odd lines FX1, 3, 5 and 7 and are separately arranged in the sub word drivers SWD disposed on the left and right sides of the sub array SBARY.

The sub word selecting line drivers FXD are separately arranged with two above and below one cross area, as indicated by solid squares in FIG. 2. In the lefthand upper cross area, more specifically: the sub word selecting line driver arranged on the lower side corresponds to the first sub word selecting line FX0B; the two sub word selecting line drivers FXD disposed in the lefthand intermediate cross area correspond to the first sub word selecting line FX2B and FX4B; and the sub word selecting line driver arranged on the upper side of the lefthand lower cross area corresponds to the first sub word selecting line FX6B.

In the center upper cross area: the sub word selecting line driver arranged on the lower side corresponds to the first sub word selecting line FX1B; the two sub word selecting line drivers FXD disposed in the center intermediate cross area correspond to the first sub word selecting line FX3B and FX5B; and the sub word selecting line driver arranged on the upper side of the center lower cross area corresponds to the first sub word selecting line FX7B. In the righthand upper cross area, moreover, the sub word selecting line driver arranged on the lower side corresponds to the first sub word selecting line FX0B; the two sub word selecting line drivers FXD disposed in the righthand intermediate cross area correspond to the first sub word selecting line FX2B and FX4B; and the sub word selecting line driver arranged on the upper side of the righthand lower cross area corresponds to the first sub word selecting line FX6B. In the sub word drivers thus disposed at the end portions of the memory array, no sub array is present on their right side so that the sub word lines SWL on the left side are exclusively driven.

With the construction of this embodiment in which the sub word selecting lines FXB are arranged between the gaps of the pitches of the main wordlines MWL over the sub arrays, no special wiring channel can be demanded so that the memory chip is not enlarged even if the eight sub word selecting lines are arranged for each sub array. With the sub word selecting line driver FXD being formed, however, the cross areas are enlarged to obstruct the higher integration. In these cross areas, more specifically, there is no areal margin for forming peripheral circuits such as a switch circuit IOSW provided to correspond to main input/output lines MIO or local input/output lines LIO, as indicated by dotted lines in FIG. 2, power MOSFETs for driving the sense amplifiers, drivers for driving the shared switch MOSFETS, or drivers for driving the precharge MOSFETs. In an embodiment of FIG. 3, therefore, the two upper/lower sub arrays share the sub word selecting line driver FXD to prevent the areal increase.

Of the cross areas, the one arranged in an extending direction A of the second even sub word selecting lines FX0 to FX6 is provided with: an N-channel power MOSFET Q15 for feeding an internal constant voltage VDL to the sense amplifiers (and an N-channel power MOSFET Q16 for feeding a power voltage VDD for an overdrive), as will be described hereinafter; and an N-channel power MOSFET Q14 for feeding an earth potential VSS of the circuit to the sense amplifiers.

Of the cross areas, the one arranged in the extending direction B of the second odd sub word selecting lines FX1 to FX7 is provided with: an inverter circuit for turning OFF a MOSFET for precharging and equalizing the bit lines; and an N-channel power MOSFET for feeding the earth potential VSS of the circuit to the sense amplifiers, although the invention is not especially limited thereto. This N-channel power MOSFET feeds the earth potential to a common source line (CSN) of MOSFETs for amplifying the N-channel MOSFET, constructing the sense amplifiers from the two sides of the sense amplifier array. To the 128 or 130 sense amplifiers belonging to the sense amplifier area, more specifically, there is fed the earth potential from both the N-channel power MOSFETs disposed in the A-side cross area and the N-Channel power MOSFETs disposed in the B-side cross area.

As described above, the sub word line driver SWD selects the sub word lines of the sub arrays on its two left and right sides. On the other hand, the two left and right sense amplifiers are activated to correspond to the sub word lines of the two sub arrays selected. When the sub word lines are brought into the selected state, more specifically, the address selecting MOSFETs are turned ON so that the charge of the storage capacitor is synthesized with the bit line charge. It is, therefore, necessary to perform the reloading operation to activate the sense amplifiers to restore the initial charge state. Excepting those corresponding to the sub arrays at the end portions, therefore, the power MOSFETs are used to activate the sense amplifiers on their two sides. In the sub word line driver SWD disposed on the right or left side of the sub arrays at the ends of their group, on the contrary, only the sub word lines of the sub arrays are selected so that the power MOSFETs activate only the sense amplifier group on one side corresponding to the sub arrays.

The sense amplifiers are made to have the shared sense construction. In the sub arrays arranged on the two sides across the sense amplifiers, these sense amplifiers perform the reloading operation to amplify the read signals of the complementary bit lines corresponding to the selected sub word lines by turning OFF to isolate the shared switch MOSFETs corresponding to the complementary bit lines on the side of the non-selected sub word lines, and to return the storage capacitors of the memory cells to the initial charge state. In this case of the embodiment, the shared switch MOSFETS of the complementary bit lines corresponding to the selected sub word lines are lowered to an intermediate potential in response to the amplifying operations of the sense amplifiers and are returned again to the select level after the read signals from the memory cells were amplified and transmitted to the input/output lines through column select circuits.

FIG. 3 shows a circuit diagram of one simplified embodiment of the dynamic RAM according to the invention around the sense amplifier portion thereof from the address input to the data output. In FIG. 3, the sense amplifier 16, as vertically sandwiched between the two sub arrays 15, and the circuit of the cross area 18 are exemplified, but the others are shown in block form. On the other hand, the circuit blocks indicated by dotted lines are individually designated by the reference characters.

One of the dynamic memory cells, which is interposed between the sub word line SWL for said one sub array 15 and one line BLT of the complementary bit lines BLT and BLB, is exemplified as a representative cell. The dynamic memory cell is constructed to include an address selecting MOSFET Qm and a storage capacitor Cs. Here, the letter T of the bit line BLT indicates the true side on which the high level corresponds to the logic 1, and the letter B of the bit line BLB indicates the bar side on which the low level corresponds to the logic 1.

The address selecting MOSFET Qm has a gate connected with the sub word line SWL, a drain connected with the bit line BL, and a source connected with the storage capacitor Cs. The other electrodes of the storage capacitors Cs are commonly fed with a plate voltage VPLT. A negative back bias voltage VBB is applied to the substrate (or channel) of the MOSFET Qm. The select level of the sub word line SWL is set to a high voltage VPP which is raised by a threshold voltage of the address selecting MOSFET Qm from the high level of the bit lines.

When the sense amplifier is operated with the internal dropped voltage VDL, the high level to be amplified by the sense amplifier and fed to the bit line is set to the level of the internal voltage VDL. Therefore, the high voltage VPP corresponding to the select level of the word lines is VDL+Vth+α. The paired complementary bit lines BLT and BLB of the sub array disposed on the left side of the sense amplifier are arranged in parallel, as shown in FIG. 3, and are suitably intersected, if necessary, so as to balance the capacities of the bit lines. These complementary bit lines BLT and BLB are connected with the input/output nodes of the unit circuit of the sense amplifier through shared switch MOSFETs Q1 and Q2.

The unit circuit of the sense amplifier is constructed to include: N-channel amplify MOSFETs Q5 and Q6 and P-channel amplify MOSFETs Q7 and Q8 having gates and drains cross-connected into a latch shape. The sources of the N-channel MOSFETs Q5 and Q6 are connected with the common source CSN. The sources of the P-channel MOSFETs Q7 and Q8 are connected with a common source line CSP. The power switch MOSFETs are individually connected with the common source lines CSN and CSP. Although the invention is not especially limited thereto, the common source line CSN, with which the sources of the N-channel amplify MOSFETs Q5 and Q6 are connected, is supplied with an operating voltage corresponding to the earth potential by the N-channel power switch MOSFET Q14 disposed in the cross area 18. The common source line CSP connected with the sources of the P-channel amplify MOSFETs Q7 and Q8 is provided with the N-channel power MOSFET Q15 disposed in the cross area 18 for feeding the internal voltage VDL.

Sense amplifier activation signals SAN and SAP1 to be fed to the gates of the N-channel power MOSFETs Q14 and Q15 are signals in phase, and the select level of the signal SAN is set to a relatively low potential such as the VDL whereas the signal SAP1 uses the power voltage VDD (or the boosted voltage VPP corresponding to the select level of the word lines, if necessary) for outputting the operating voltage, e.g., VDL from the MOSFET Q15.

A sense node or the input/output node of the unit circuit of the sense amplifier is provided with a precharge circuit, which is constructed to include an equalize MOSFET Q11 for shorting the complementary bit lines, and switch MOSFETs Q9 and Q10 for feeding a half precharge voltage VBLR to the complementary bit lines. The gates of these MOSFETs Q9 to Q11 are commonly supplied with a precharge signal PCB. The driver circuit for generating the precharge signal PCB is provided in the cross area with an inverter circuit, although not shown, for raising the falling speed thereof. At the starting time of the memory access, more specifically, prior to the word line selecting timing, the MOSFETs Q9 to Q11 which form the precharge circuit are quickly switched through the inverter circuits which are dispersedly disposed in the individual cross areas.

In addition to the circuits shown in FIG. 3, there are provided, if necessary, in the cross area 18 a half precharge circuit for setting the common source lines CSP and CSN of the sense amplifier at an inactive time to a half precharge voltage (VDL/2), a half precharge circuit for local input/output lines LIOT and LIOB, a disperse driver circuit for shared select signal lines SHR and SHL, and so on.

The unit circuit of the sense amplifier is connected through shared switch MOSFETs Q3 and Q4 with the similar complementary bit lines BLT and BLB of the sub array 15 on the lower side of the drawing. Switch MOSFETs Q12 and Q13 form a column switch circuit, which is turned ON when the select signal YS is set to the select level (or high level), to the sense nodes or the input/output nodes of the unit circuit of the sense amplifier with local input/output lines LIO1T, LIO1B, LIO2T and LIO2B. When the sub word line SWL of the sub array on the upper side is selected, for example, the shared switch MOSFETs Q1 and Q2 on the upper side of the sense amplifier are left ON whereas the shared switch MOSFETs Q3 and Q4 on the lower side are turned OFF.

As a result, the input/output nodes of the sense amplifier are connected with the upper side complementary bit lines BLT and BLB, to amplify the minute signal of the memory cell connected with the selected sub word line SWL thereby to transmit the amplified signal through the column switch circuit (Q12 and Q13) to the local input/output lines LIO1T and LIO1B. These local input/output lines LIO1T and LIO1B are connected through the switch circuit IOSW, which is disposed in the cross area 18 and composed of N-channel MOSFETs Q19 and Q20, with main input/output lines MIOT and MIOB connected with the input terminal of a main amplifier 61. Although not shown, the speed can be raised higher by using a so-called "analog gate", in which a P-channel MOSFET is provided in parallel with the MOSFETs Q19 and Q20. By using the power voltage VDD in place of a dropped voltage VPERI as the gate voltage of the MOSFETs Q19 and Q20, on the other hand, the ON resistance can be lowered to raise the speed. With the main input/output lines MIOT and MIOB, on the other hand, there are connected the output terminals of a write amplifier, although not shown.

Although the invention is not especially limited thereto, in response to one select signal YS, the column switch circuit connects the two pairs of complementary bit lines BLT and BLB with the two pairs of local input/outputslines LIO1T and LIO1B, and LIO2T and LIO2B. In the sub array selected by the selecting operation of one main word line, therefore, a total of four pairs of complementary bit lines are selected by the two pairs of the column switch circuit, which are provided to correspond to one pair of sense amplifiers on the two sides, so that 4 bits can be simultaneously read/written by selecting one signal YS.

An address signal Ai is fed to an address buffer 51. This address buffer operates in a timing sharing manner to fetch an X address signal and a Y address signal. The x address signal is fed to a predecoder 52 so that the select signal of the main word line MWL is generated through the main row decoder 11 and the main word driver 12. The address buffer 51 receives the address signal Ai fed from the external terminal, so that it is operated with the power voltage VDD fed from the external terminal, and the predecoder is operated with the dropped voltage VPERI, whereas the main word driver 12 is operated with the boosted voltage VPP. A column decoder (or driver) 53 generates the column select signal YS in response to the Y address signal which is fed by the time sharing operation of the address buffer 51.

The main amplifier 61 is operated with the, dropped voltage VPERI so that its signal is outputted from an external terminal Dout (or DQ) through an output buffer 62, which is operated with the power voltage VDD fed from the external terminal. A write signal, as inputted from an external terminal Din (or DQ), is fetched through an input buffer 63 and is fed to the main input/output lines MIOT and MIOB through a later-described write amplifier, which contained in the main amplifier 61, as shown. The output buffer is provided at its input portion with a level shift circuit, as will be described in the following, and a logic unit for outputting the signal having a shifted level, in synchronism with the timing signal.

Although the invention is not especially limted thereto, the power voltage VDD fed from the external terminal is set to 2.5 V, and both the dropped voltage VPERI fed to the internal circuit and the operating voltage VDL of the sense amplifier are set to 1.8 V. In this case, these voltages are generated, although at the same level, by power circuits (or voltage step-down circuits) independent of each other, so that the power noise due to the operations of the peripheral circuits may not affect the amplifying operation of the sense amplifier. The boosted voltage VPP to be used for the select signal and the unselect signal of the word lines (or sub word lines or main word lines) are set to 3.5 V. The precharge voltage VBLR of the bit lines is set to 0.9 V equal to VDL/2, and the plate voltage VPLT is also set to 0.9 V. Moreover, the substrate voltage VBD is set to −1.0 V.

Figure 4:
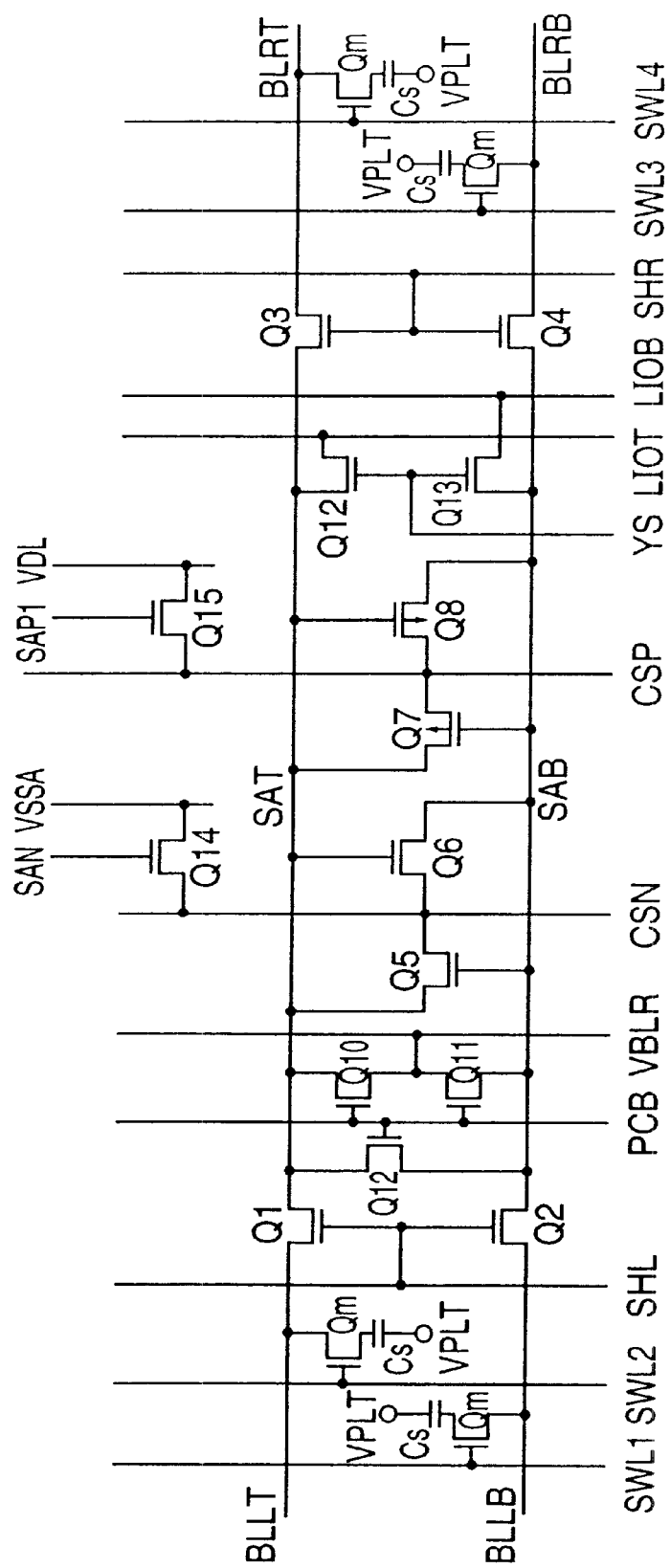
FIG. 4 is a circuit diagram showing one embodiment of the sense amplifier portion of the, dynamic RAM according to the invention.

FIG. 4 is a circuit diagram showing one embodiment of the sense amplifier portion of the dynamic RAM according to the invention. The circuit of FIG. 4 is basically identical to that shown in FIG. 3. A CMOS latch circuit constructing a unit circuit of the sense amplifier is constructed to include the N-channel MOSFETs Q5 and Q6 and the P-channel MOSFETs Q7 and Q8, as formed in a latch shape. The sources of these N-channel MOSFETs Q5 and Q6 and the P-channel MOSFETs Q7 and Q8 in the latch shape are connected with the common source lines CSN and CSP which are commonly commected with the sources of N-channel MOSFETs and P-channel MOSFETs constructing another not-shown similar sense amplifier, as disposed to correspond to the same sub array.

An operating voltage VSSA is fed to the common source line CSN through the N-channel MOSFET Q14 for receiving the timing signal SAN, and the operating voltage VDL is fed to the common source line CSP through the N-channel MOSFET Q15 for receiving the timing signal SAP1. In this embodiment, the earth potential VSSA used as one operating voltage of the sense amplifier is fed with the earth potential fed from the external terminal by the earth line separated from that earth potential VSS, so as to receive no influence of noises from the peripheral circuits or the like. In short, the earth potential VSSA fed to the sense amplifier is fed with the earth potential of the circuit directly from the external terminal through the wiring line which is provided separately from the peripheral circuits or the input/output circuits.

At a pair of input/output nodes (or sense nodes) SAT and SAB of the latch circuit, there is provided the precharge circuit which is constructed to include the equalize MOSFET Q12 for shorting those input/output nodes, and the precharge MOSFETs Q10 and Q11 for transmitting the half precharge voltage VBLR to the sense nodes SAT and SAB. On the other hand, the sense nodes SAT and SAB are connected with the local input/output lines LIOT and LIOB through the column switch MOSFETs Q12 and Q13 having gates fed with the column select signal YS. Moreover, the shared switch MOSFETs Q1 and Q2 are provided between complementary bit lines BLLT and BLLB disposed on the left side across the sense amplifier portion, and the shared switch MOSFETs Q3 and Q4 are provided between complementary bit lines BLRT and BLRB disposed on the right side.

The control signal SHL is fed to the gates of the shared switch MOSFETs Q1 and Q2, and the control signal SHR is fed to the gates of the shared switches Q3 and Q4. At each of the intersections between the complementary bit lines BLLT and BLLB on the left side of the sense amplifier portion and the sub word lines SWL1, SWL2 and so on arranged to intersect the former at a right angle, there is disposed the dynamic memory cell which is constructed to include the address selecting MOSFET Qm and the storage capacitor Cs, as described hereinbefore. Likewise, at each of the intersections between the complementary bit lines BLRT and BLRB on the right side of the sense amplifier portion and the sub word lines SWL3, SWL4 and so on arranged to intersect the former at a right angle, there is disposed the dynamic memory cell which is constructed to include the address selecting MOSFET Qm and the storage capacitor Cs, as described hereinbefore.

Figure 5:
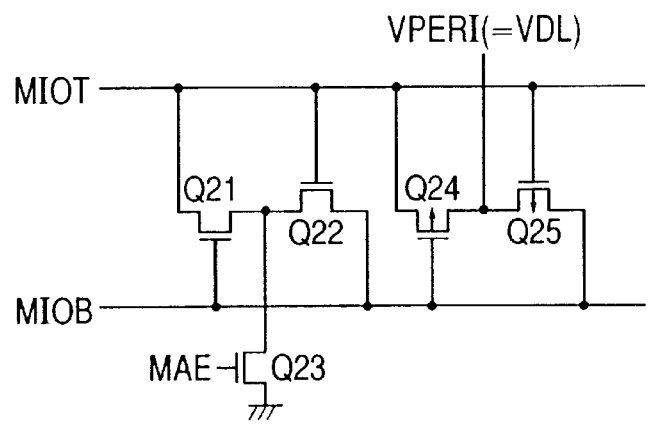
FIG. 5 is a circuit diagram showing one embodiment of the main amplifier shown in the embodiment of FIG. 3.

FIG. 5 is a circuit diagram showing one embodiment of the main amplifier shown in the embodiment of FIG. 3. The main amplifier is constructed to include: a CMOS latch circuit having N-channel MOSFETs Q21 and Q22 and P-channel MOSFETs Q24 and Q25 in the latch shape as in the sense amplifier; and an N-channel MOSFET Q23 connected between the commonly connected sources of the N-channel MOSFETs Q21 and Q22 and the earth potential of the circuit. The input/output nodes of the CMOS latch circuit are connected with the main input/output lines MIOT and MIOB, as described hereinbefore. The commonly connected sources of the P-channel MOSFETs Q24 and Q25 in the latch shape are fed with the operating voltage VPERI. This voltage VPERI is set at the same voltage as the operating voltage VDL of the sense amplifier.

Although the invention is not especially limited thereto, the main input/output lines MIOT and MIOB are precharged together with the local input/output lines LIOT and LIOB to VPERI (VDL) by the not-shown precharge circuit disposed on those local input/output LIOT and LIOB. On the output signals read out to the local input/output lines LIOT and LIOB and the main input/output lines MIOT and MIOB by the amplifying operations of the sense amplifier, therefore, one of the main input/output lines MIOT and MIOB changes from the precharge potential (VPERI=VDL) to a voltage dropped to the low level side, and the MOSFET Q23 is turned ON with the timing signal MAE so that the potential difference is amplified by the N-channel MOSFETs Q21 and Q22 in the latch shape.

Figure 6:
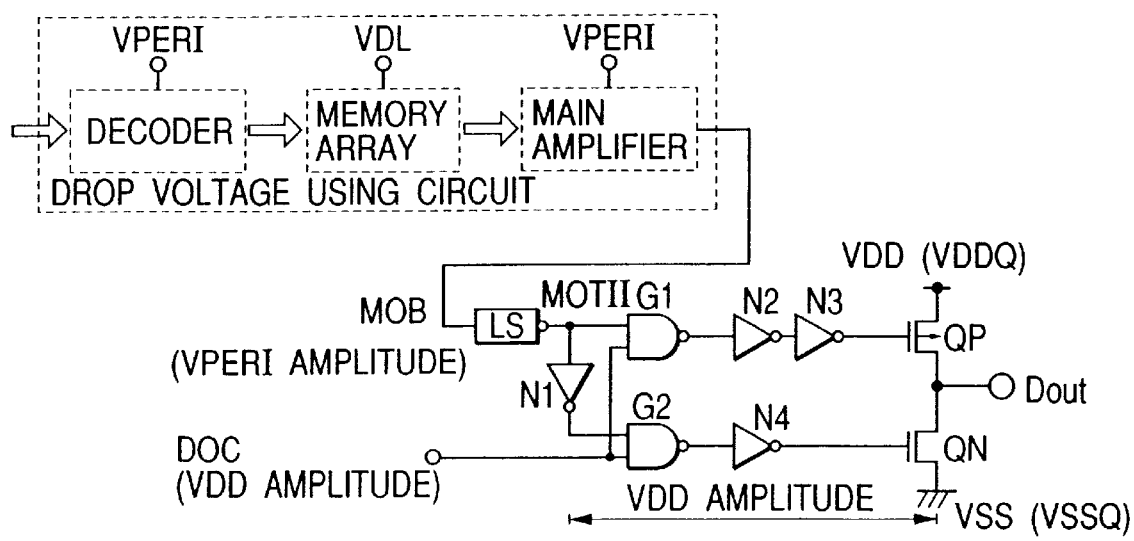
FIG. 6 is a circuit diagram showing one embodiment of the output buffer of the dynamic RAM according to the invention.

FIG. 6 is a circuit diagram showing one embodiment of the output buffer of the dynamic RAM according to the invention. In FIG. 6, there is also shown a circuit block which shows the entire operations of the dynamic RAM. Specifically, the decoder is operated with the dropped voltage VPERI to generate a decoded signal having a corresponding signal amplitude. The main word driver is operated with the boosted voltage VPP. The memory array outputs the read signal having a signal amplitude corresponding to the operating voltage VDL of the sense amplifier, as described hereinbefore. The main amplifier is operated with the dropped voltage VPERI to generate a corresponding read signal MOB. Here, the letter B of the MOB indicates that the logic "1" is at the low level whereas the logic "0" is at the light level, and the inverted signal is designated by the MOT.

In the output buffer, the output signal MOB of the main amplifier converts (or amplifies) the signal level corresponding to the dropped voltage VPERI to a voltage level corresponding to the external power voltage VDD by a level shift circuit LS. This amplified signal MOTH is fed to one input of a NAND gate circuit G1. On the other hand, the signal MOTH is inverted by an inverter circuit N1 and fed to one input of a NAND gate circuit G2. The other inputs of these NAND gate circuits G1 and G2 are supplied with a data output timing signal DOC at a signal level corresponding to the power voltage VDD. Output MOSFETs QP and QN have large gate capacities because they are formed to have relatively large sizes for achieving high load driving abilities. In order to drive those output MOSFETs QP and QN at a high speed, the output signals of the gate circuits G1 and G2 are sequentially transmitted through inverter circuits N2 to N4.

The power voltage VDD to be fed to the source of the P-channel output MOSFET QP of the output buffer is fed through an independent power terminal VDDQ and the power line with the operation voltage so that the P-channel output MOSFET QP may cause a relatively high operating current to flow. Likewise, the earth potential to be applied to the source of the P-channel output MOSFET QN is fed through an independent earth terminal VSSQ and the power line. The P-channel output MOSFET QP can be replaced by an N-channel output MOSFET. In order to achieve the output level up to the power voltage VDD, however, a boosted voltage may be fed to the gate. This boosted voltage may utilize the boosted voltage VPP of the word line or the like but is generally generated by a bootstrap circuit.

Figure 7:
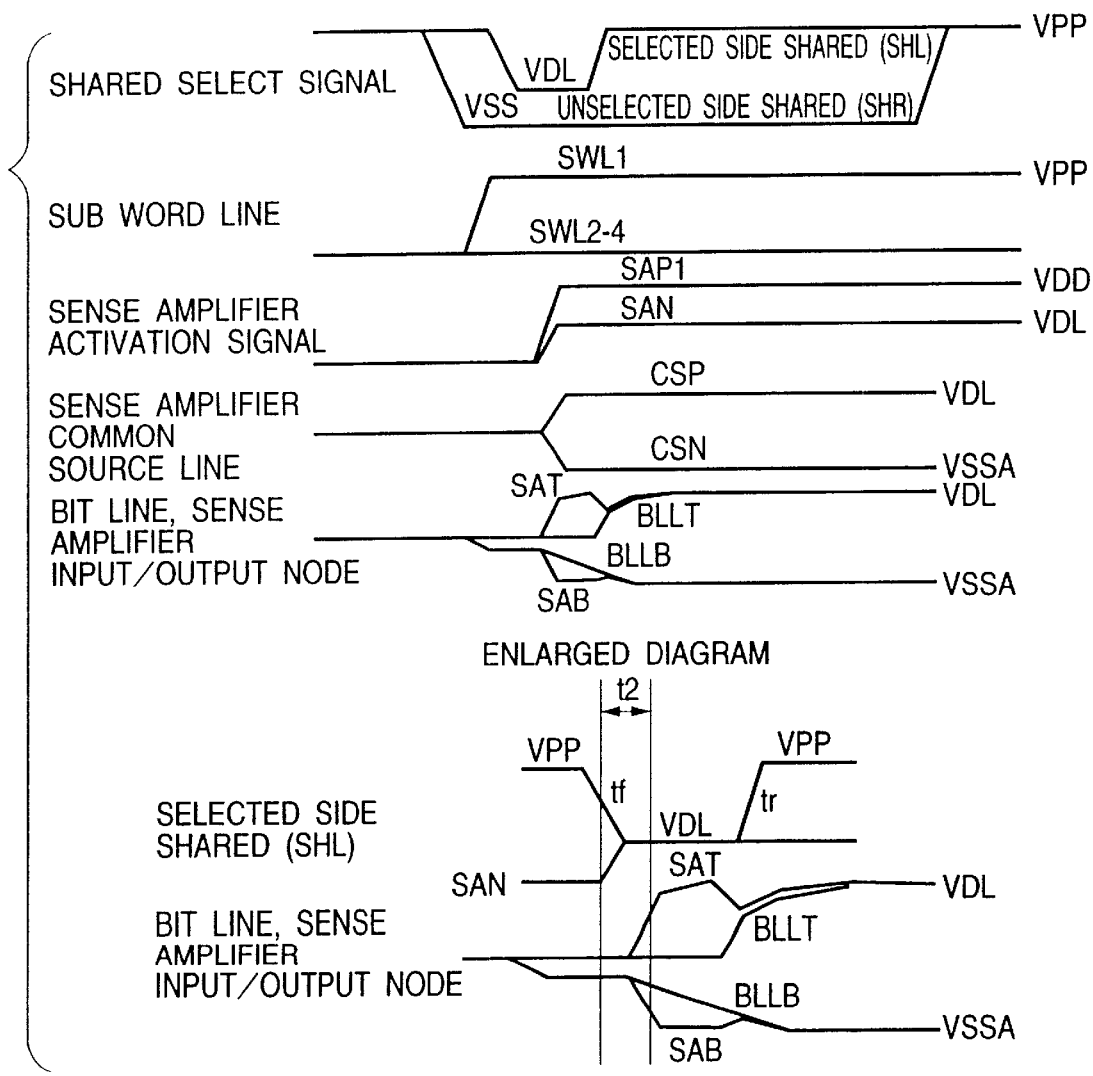
FIG. 7 is a timing chart for explaining one example of the reading operation of the dynamic RAM according to the invention.

FIG. 7 is a timing chart for explaining one example of the reading operation of the dynamic RAM according to the invention. The shared select signals SHR and SHL are set for the precharge period to the select level such as the boosted voltage VPP. By the precharge circuit disposed at the sense node of the sense amplifier, therefore, the complementary bit lines BLLT and BLLB and so on, as disposed on the left and right sides of the precharge circuit, are set to a half precharge voltage VBLR (=VDL/2).

Before the sub word line SWL1 is selected, the shared select signal SHR corresponding to the sub array on the unselected side is set to an unselect level such as the earth potential VSS of the circuit. Therefore, the sense amplifier is isolated from the complementary bit line on the right side so that a minute voltage difference corresponding to the stored charge of the selected memory cell is generated on the complementary bit lines BLLT and BLLB on the left side by the selecting operations of the sub word line SWL1.

Before the minute voltage is generated so that the sense amplifier starts its amplifying operation, the shared select signal SHL is dropped to an intermediate voltage such as the dropped voltage VDL. Then, the sense amplifier activation signals SAN and SAP1 are raised to the high level to start the amplifying operation of the sense amplifier. Specifically, the power switch MOSFET Q14 is turned ON with the sense amplifier activation signal SAN to drop the common source line CSN of the sense amplifier from the half precharge voltage to a potential such as the earth potential VSSA of the circuit, and the power switch MOSFET Q15 is turned ON with the sense amplifier activation signal SAP1 to raise the common source line CSP of the sense amplifier from the half precharge voltage to the operating voltage VDL.

In this amplifying operation, as shown in the enlarged diagram, the potential of the shared select signal SHL on the selected side drops to a low potential such as VDL, and the switch MOSFETs Q1 and Q2 connect the bit lines BLLT and BLLB with a relatively large ON resistance because the potential between the sense nodes SAT and SAB is as small about 0.9 V. Therefore, a high parasitic capacity of the bit lines BLLT and BLLB is not directly connected with the sense nodes SAT and SAB so that the sense nodes SAT and SAB are quickly extended in a manner to correspond to the minute potential difference by the amplification start of the sense amplifier.

Specifically, the sense node SAT corresponding to the read signal at the high level quickly rises to the VDL because the switch MOSFET Q1 is OFF. In the sense node SAB corresponding to the read signal at the low level, on the other hand, the potential between the gate and the source of the switch MOSFET Q2 is extended in response to the drop of the potential to strengthen the coupling to the bit line BLLB thereby to drop the potential of the bit line BLLB.

At the time of starting the amplification of the sense amplifier, more specifically, the switch MOSFET Q1 is turned OFF, and the switch MOSFET Q2 is turned ON with a large resistance, to provide a coarse coupling between the sense node and the bit lines BLLT and BLLB. As a result, the minute potential difference is quickly enlarged by the amplifying operation of the sense amplifier, and the switch MOSFET Q2 on the low level side densifies the coupling to the bit line BLLB in a manner to correspond to the extension of the amplification voltage thereby to promote the drop of the potential of the bit line BLLB. In other words, the switch MOSFET Q2 at this time functions as the so-called "linear amplification MOSFET Q2" having a grounded gate and a source input thereby to drop the potential of the bit line BLB.

The sense amplifier performs high-speed operations utilizing the positive feedback loop with the minute voltage to be transmitted to the sense nodes SAT and SAB. If noises rise at the amplification starting time to invert the potential difference with respect to the read level, an erroneous reading operation is caused, that is, the amplified output is reloaded in the memory cells to cause an erroneous storing operation. At the amplification starting time of the sense amplifier, therefore, the coupling to the bit lines is coarse because the gate-source voltage is in the vicinity of a threshold voltage, even if the shared switch MOSFETs Q1 and Q2 are ON. Therefore, the minute potential difference is quickly enlarged while preventing the influences of noises from the bit line side. In response to this enlargement, the switch MOSFET Q1 on the high level side is turned OFF, and the ON resistance of the switch MOSFET Q2 is gradually reduced in response to the enlargement of the amplification signal to the low level side, so that the potential is lowered by densifying the coupling to the bit lines when the amplifying operation is performed quickly and stably.

Thus, the sense node SAB is given a substantially high signal charge by the connection with the bit line BLLB having a relatively high parasitic capacity through the switch MOSFET Q2. When the sense node SAB is connected with the local bit line in response to the column select signal YS, therefore, the signal amount to be read out by the charge share with the local bit line can be increased to effect a fast reading.

Figure 8:
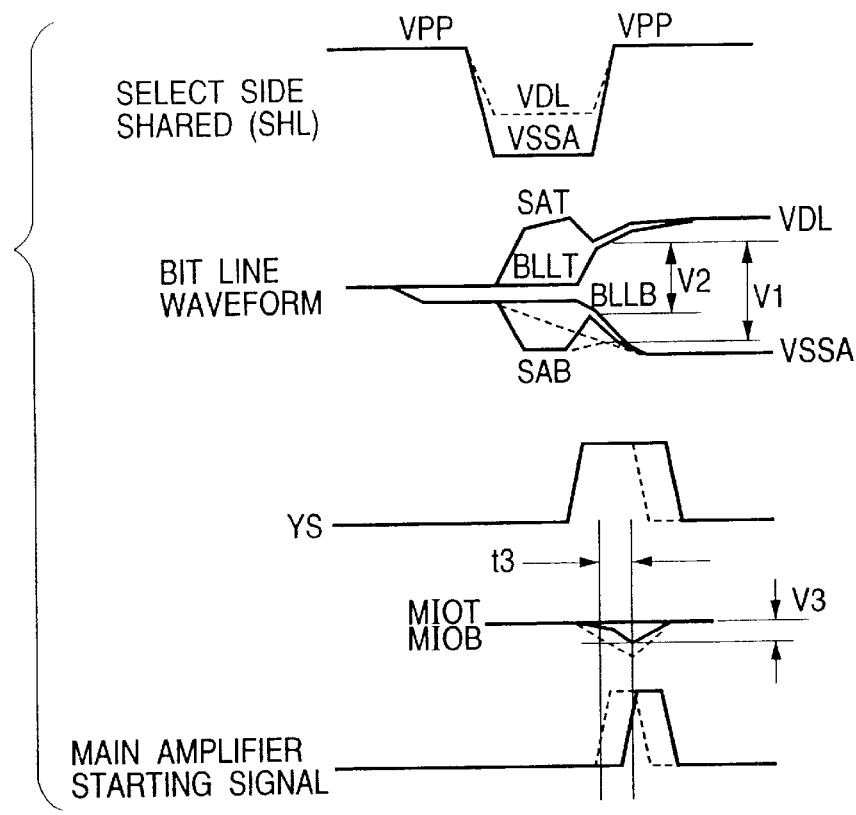
FIG. 8 is a timing chart for explaining the reading operation of the dynamic RAM according to the invention.

FIG. 8 is a timing chart for explaining the reading operation of the dynamic RAM according to the invention. This timing chart is intended to explain the superiority of the reading operation at the intermediate potential in accordance with the invention, by comparing the reading operation of the prior art, in which the shared switch MOSFET on the selected side is completely turned OFF.

When the sense amplifier is activated by setting the shared select signal SHL to the low level such as the earth potential VSSA of the circuit, as shown in FIG. 8, the potentials of the sense nodes SAT and SAB abruptly enlarge their minute reading potential difference. When the shared select signal SHL is returned to the select level, however, the sense nodes SAT and SAB are shifted to the bit line potential side by the charge share between the bit lines BLT and BLB having the relatively high parasitic capacity so that their potential difference becomes as small as V2. When the column select signal YS is set to the high level at this timing and is connected with the local input/output lines for the reading operation, the signal amount to be transmitted through the local input/output lines to the main input/output lines MIOT and MIOB is delayed to reach a voltage V3 necessary for the amplifying operation of the main amplifier connected therewith. Therefore, the column select signal YS is set at the select level until the voltage level V3 is achieved, so that the connection between the sense nodes and the local input/output lines has to be maintained.

On the contrary, when the shared select signal SHL on the selected side is dropped to the intermediate potential VDL, as indicated by dotted lines, as in the invention, the potential of the bit line BLB has been dropped even if the shared select signal SHL is returned to the select level, because the amplified output on the low level side is transmitted to the bit line BLB for the amplification period of the sense amplifier. As a result, the potential difference between the sense nodes SAT and SAB is enlarged as indicated by V1. When the column select signal YS is raised to the high level to effect the reading operation with the connection being made with the local input/output lines, therefore, the signal amount to be transmitted through the local input/output lines to the main input/output lines MIOT and MIOB can be increased, as indicated by dotted lines in FIG. 8, so that the time period to reach the voltage level V3 necessary for the amplifying operation of the main amplifier connected therewith can be shortened. In accordance with this, an activation signal MAE of the main amplifier can be timed earlier, and the select period of the column select signal YS can be shortened.

The intermediate voltage should not be limited to the operating voltage VDL of the sense amplifier. This intermediate potential may be ideally within VT2<Intermediate Potential<VT1, if the threshold voltages of the MOSFETs Q1 and Q2 are designated by VT1 and VT2. Even with another range of VT1, VT2<Intermediate Potential, however, there arises no problem so long as the ON resistance is so high as to exert no substantial influence upon the start of amplification of the sense amplifier.

The threshold voltages VT1 and VT2 are expressed by the following formulas (1) and (2):

$$VT1=VT10+Kv|VBB-VSAT|+2\Phi F-\sqrt{2\Phi F} \qquad (1);$$

and $$VT2=VT20+Kv|VBB-VSAB|+2\Phi F-\sqrt{2\Phi F} \qquad (2).$$

Here: VT10 a threshold voltage for VBB−VSAT=0; VT20 a threshold voltage for VBB−VSAB=0; K a substrate effect constant; VSAT a voltage value of the sense node SAT; VSAB a voltage value of the sense node SAB; VBB a substrate voltage; and Φ F a Felmi-level.

Figure 9:
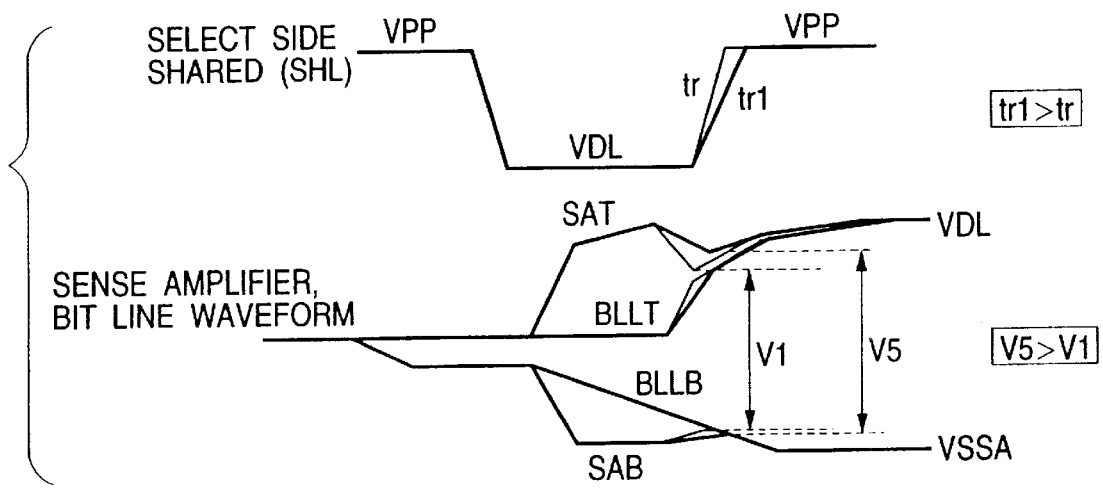
FIG. 9 is a timing chart for explaining another example of the reading operation of the dynamic RAM according to the invention.

FIG. 9 is a timing chart for explaining another example of the reading operation of the dynamic RAM according to the invention. In this embodiment, when the shared select signal SHL on the selected side is set to the intermediate potential VDL returned to the select level such as the voltage VPP, the rising time tr is delayed to tr1. As a result, the coupling between the bit line BTL and the sense node SAT on the high level side is made gentle to reduce the drop of the bit line BLT. As a result, the potential difference between the sense nodes SAT and SAB can be enlarged from V1 to V5. This makes it possible to read out the sense output at a high speed to the data input/output lines.

Figure 10:
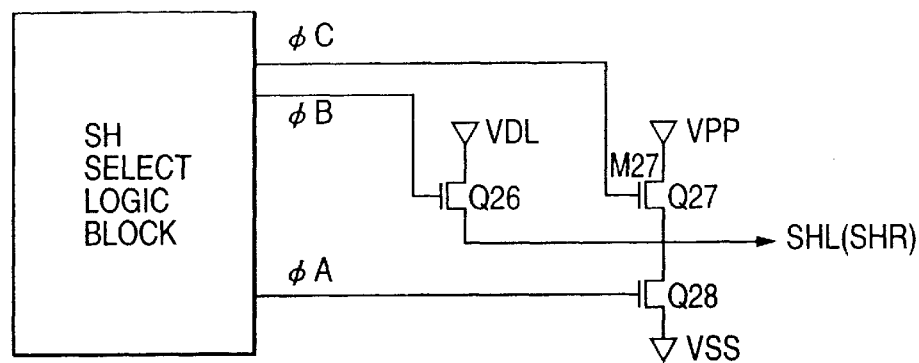
FIG. 10 is a circuit diagram showing one embodiment of the timing generation circuit for generating the shared select signal.

FIG. 10 is a circuit diagram showing one embodiment of the timing generation circuit for generating the shared select signal. Three timing signals ØA, ØB and ØC are generated by an SH select logic block. For example, the timing signals ØB and Øc are generated on the selected side, whereas the timing signals ØA and ØC are generated on the unselected side. On the selected side, more specifically, the timing signals ØC, ØB and ØC are generated to turn ON output MOSFETs Q27, Q26 and Q27 correspondingly, so that the SHL (SHR) potential is set to a binary voltage of VPP–VDL–VPP. On the unselected side, the timing signals ØC, ØA and ØC are generated to turn ON output MOSFETs Q27, Q28 and Q27 correspondingly so that the SHL (SHR) potential is set to a binary voltage of VPP–VSS–VPP.

When the select level is set at the VPP level, as described above, the select level of the timing signal ØC is set to the boosted voltage of VPP+VT27 for the MOSFET Q27 made of an N-channel MOSFET. For the MOSFET Q27 made of a P-channel MOSFET, the timing signal ØC has the unselect level of VPP and the select level of VSS.

When the rise from the intermediate voltage VDL to the select level VPP is to be delayed, as shown in FIG. 9, the MOSFET Q27 may be made of two MOSFETs connected in parallel to turn ON the two MOSFETs simultaneously for the rise from VSS to VPP and one of them for the rise from VDL to VPP. Alternatively, the rise of the timing signal ØC may be delayed. By thus changing the size of the MOSFETs and the gate input voltage, it is possible to make the selective signal level changes.

Figure 11:
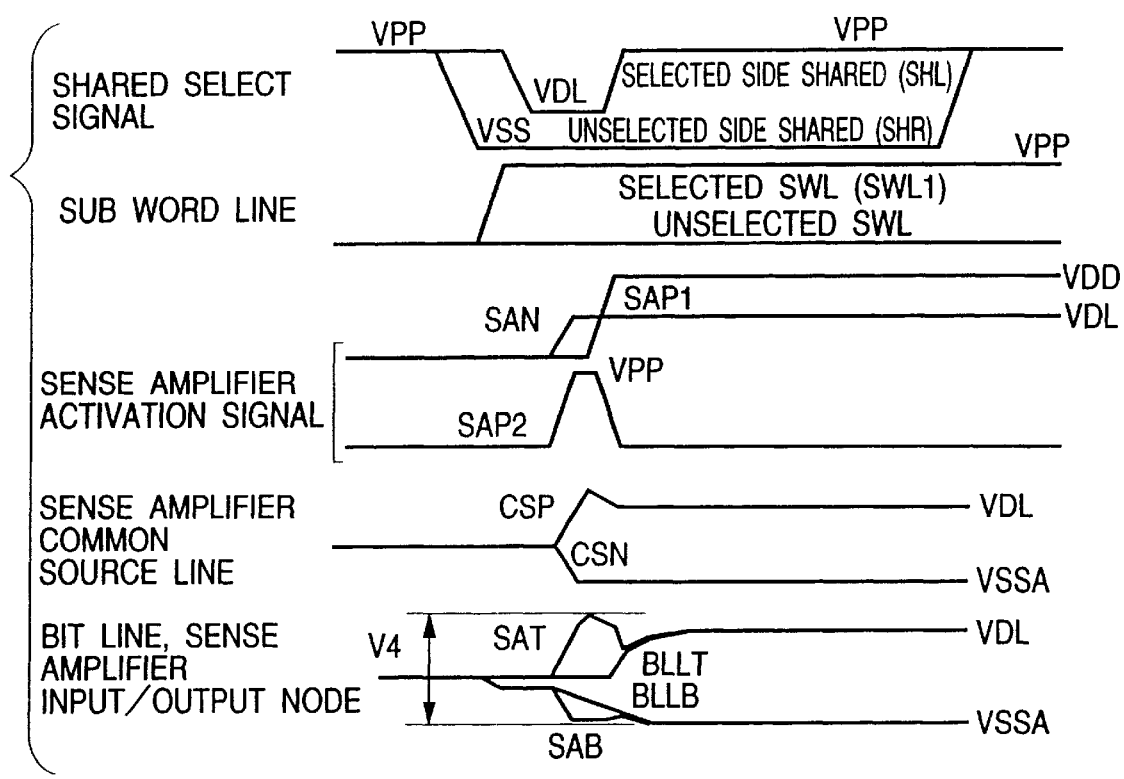
FIG. 11 is a timing chart for explaining another example of the reading operation of the dynamic RAM according to the invention.

FIG. 11 is a timing chart for explaining another example of the reading operation of the dynamic RAM according to the invention. In this embodiment, the sense amplifier is overdriven. Specifically, the voltage VDD higher than the operating voltage VDL is fed to the common source line CSP of the P-channel MOSFETs of the sense amplifier to steepen its rise thereby to quicken the rise of the sense output on the high level side. For this, a timing signal SAP2 is added as the timing signal for driving the common source line CSP. This timing signal SAP2 is temporarily raised to a high voltage such as the VPP level simultaneously with the timing signal SAN thereby to make the common source line CSP temporarily higher than VDL. In response to the change of this timing signal SAP2 to the unselect level, the timing signal SAP1 is generated with a delay to feed the common source line CSP with the operating voltage VDL.

By this overdrive of the sense amplifier, the voltage difference between the sense nodes SAT and SAB can be increased to as large as V4. As a result, the drop of the sense node SAT when the shared select signal SHL is returned from the intermediate voltage VDL to the select voltage VPP can be compensated by the overdrive voltage, thereby to quicken the reading operation to the data input/output lines by the column select signal YS.

Figure 12:
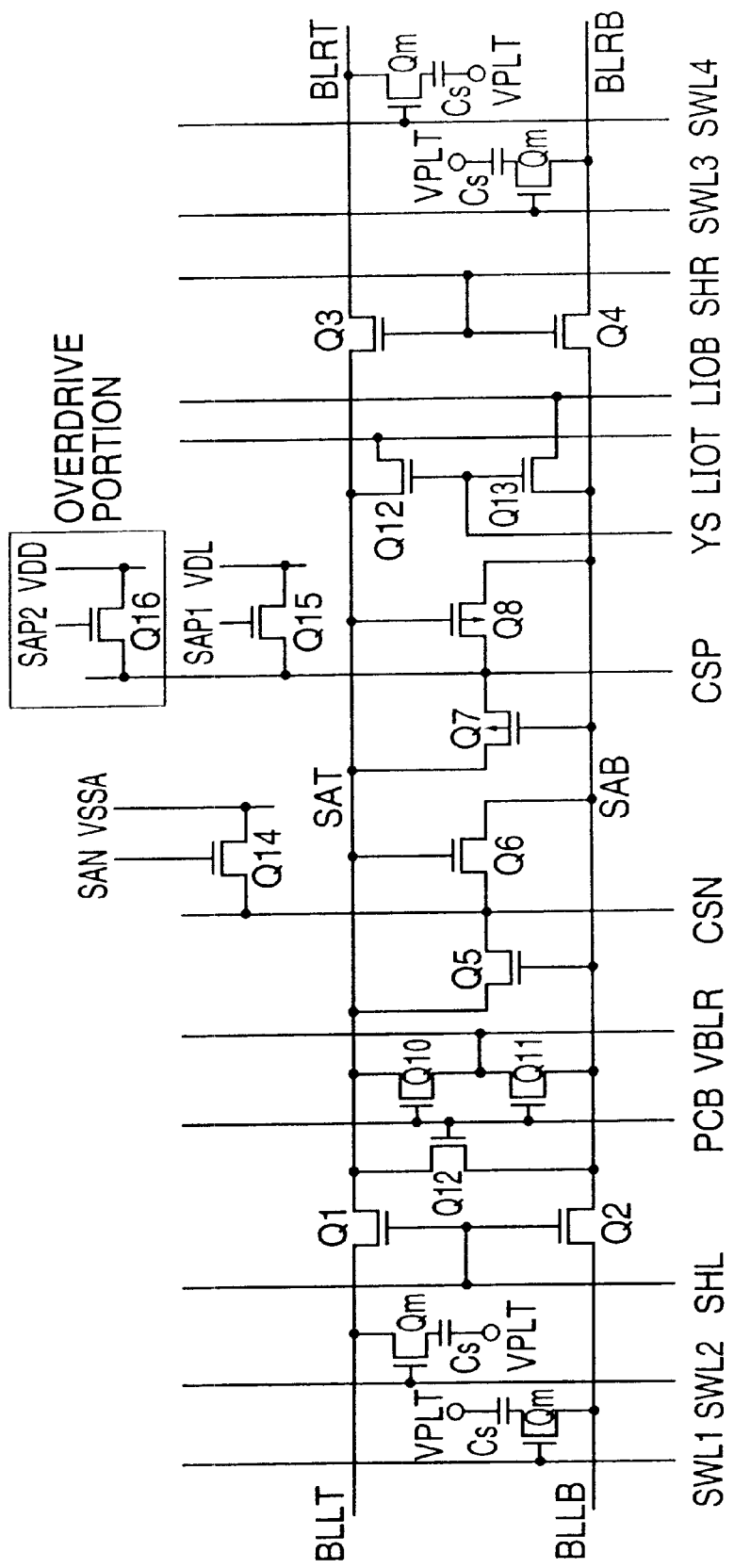
FIG. 12 is a circuit diagram showing one embodiment of the sense amplifier having the overdrive function.

FIG. 12 is a circuit diagram showing one embodiment of the sense amplifier having the overdrive function. To the common source line CSP which is connected with the sources of the P-channel MOSFETs Q7 and Q8 of the sense amplifier, there is added not only the power switch MOSFET Q15 but also the N-channel MOSFET Q16 forming the overdrive portion. This MOSFET Q16 operates to feed the power voltage VDD to the common source line CSP in response to the timing signal SAP2. In order to output the power voltage VDD from the source of the MOSFET Q16, the select level of the timing signal SAP2 to be fed to the gate is set to a voltage as high as the boosted voltage VPP.

In order to lighten the dependency of the sense amplifier operating speed upon the power voltage VDD, the boosted voltage VPP may be applied, as the overdrive voltage, in place of the power voltage VDD, as fed from the external terminal, to the gate, and the drain may be connected with the power voltage VDD so that a voltage slightly dropped from the power voltage VDD may be used from the source. By adding such an overdrive portion, in response to the timing signal SAP2, the potential of the common source line CSP or the operating voltage of the sense amplifier can be temporarily raised to a voltage as high as VDD.

Figure 13:
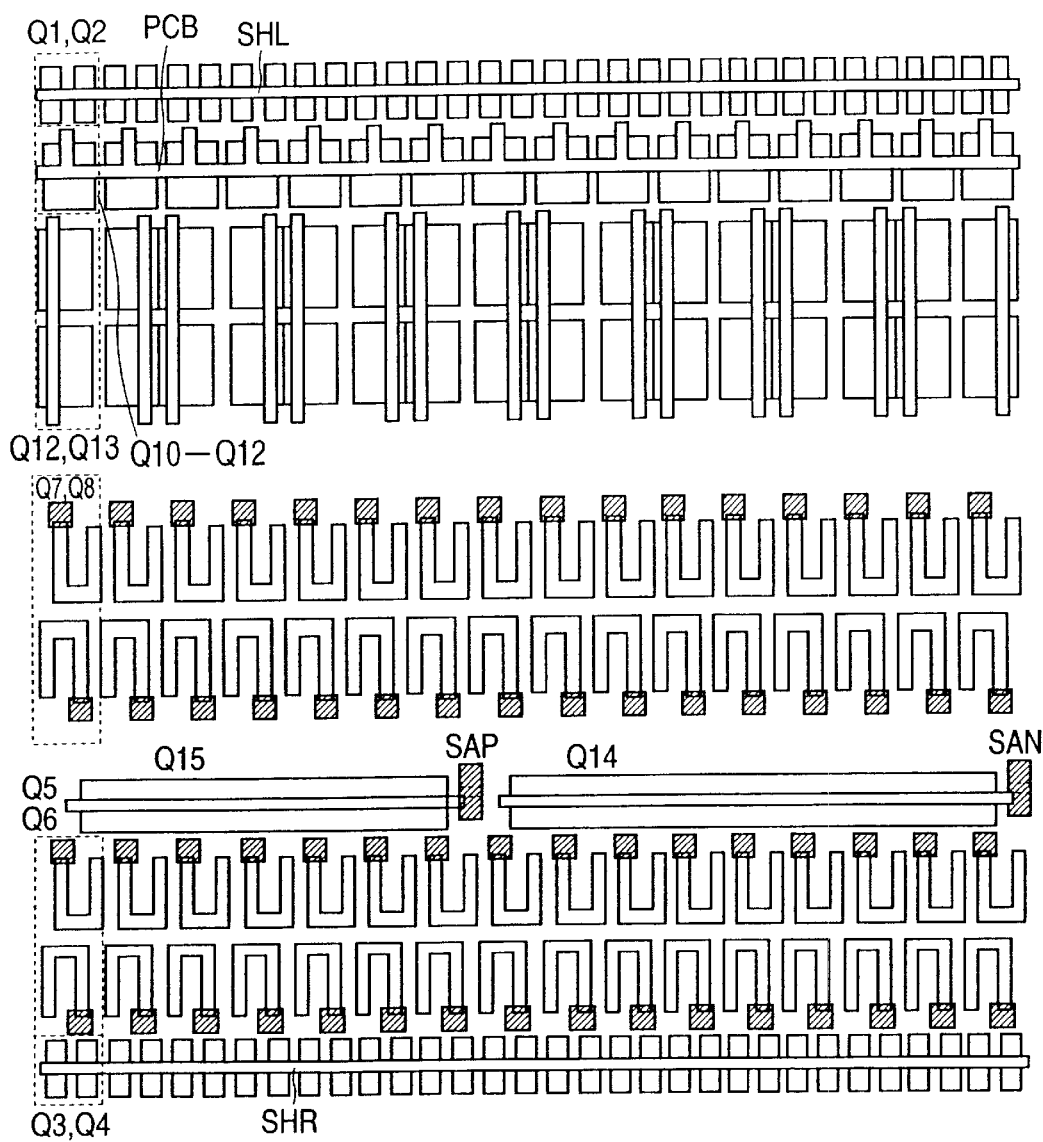
FIG. 13 is a schematic element layout diagram showing one embodiment of the sense amplifier portion to be used in the dynamic RAM according to the invention.

FIG. 13 is a schematic element layout diagram showing one embodiment of the sense amplifier portion to be used in the dynamic RAM according to the invention. In this embodiment, the power switch MOSFETs Q14 and Q15 for driving the sense amplifier are dispersed and arranged along the sense amplifier array. In other words, the power switch MOSFETs Q14 and Q15 are not arranged together to have a large size in the cross area, as described hereinbefore, but are dispersed in the sense amplifier array to have a small element size.

In this embodiment, although the invention is not especially limited thereto, the two MOSFETs Q14 and Q15 are arranged to correspond to the sixteen unit circuits. A specific description will be made by taking up the unit circuit on the left hand as an example. There are arranged consecutively from the upper side: the shared switch MOSFETs Q1 and Q2; the MOSFETs Q10 to Q12 forming the precharge circuit; the switch MOSFETs Q12 and Q13 forming the column select circuit; the P-channel amplify MOSFETs Q7 and Q8 forming the CMOS latch circuit; the N-channel amplify MOSFETs Q5 and Q6 forming the CMOS latch circuit across the region forming the power switch MOSFETs Q14 and Q15; and the shared switch MOSFETs Q3 and Q4.

In order to elongate the gate along the sense amplifier array, the power switch MOSFETS Q14 and Q15 are provided to have a larger channel width than that of the shared switch MOSFETs, that is, to have a larger element size thereby to allow a larger current to flow therethrough. In this case the MOSFET Q14 for driving the common source line CSN of the N-channel MOSFETs is fed at its gate with a relatively low potential such as VDL so that it is made to have a larger size than that of the MOSFET Q15 having a gate supplied with the power voltage VDD or the boosted voltage VPP. When the power switch MOSFETs for driving the sense amplifier are thus dispersed and arranged, the distance between the sense nodes and the power switch MOSFETs can be shortened to equalize the operation timings of the plurality of sense amplifiers provided in the sub array and to utilize the cross area effectively for another circuit.

Figure 14:
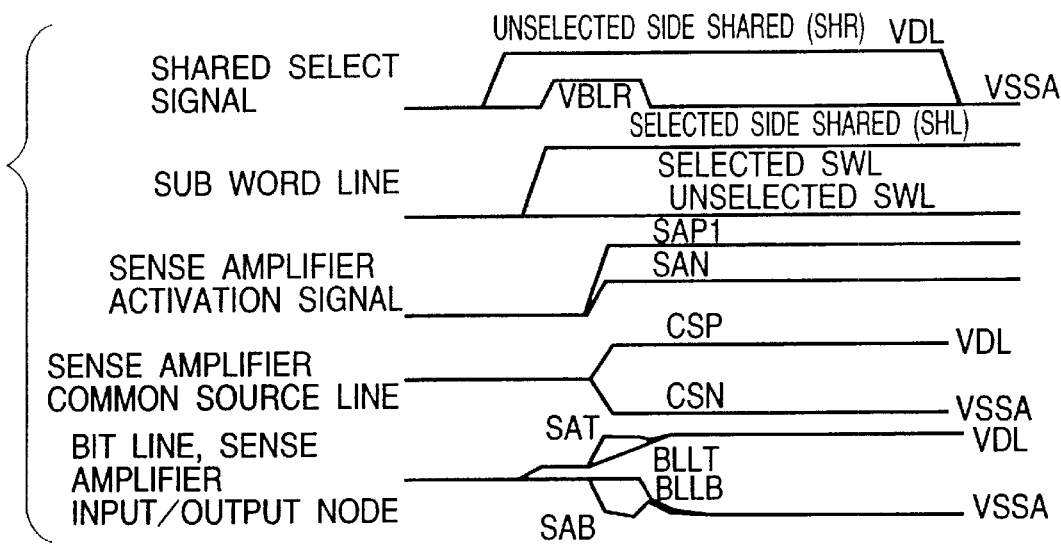
FIG. 14 is a timing chart for explaining another example of the reading operation of the dynamic RAM according to the invention.

FIG. 14 is a timing chart for explaining another example of the reading operation of the dynamic RAM according to the invention. In this embodiment, the timing chart is shown to correspond to the example in which the shared switch MOSFETs are made of P-channel MOSFETs. When the shared switch MOSFETs are made of the P-channel MOSFETs, the select level is set to the earth potential, e.g., VSSA of the circuit, and the unselect level is set to a voltage such as the dropped voltage VDL corresponding to the high level of the bit lines.

Therefore, the shared select signal SHL to be fed to the shared switch MOSFETs on the selected side is set to the potential which corresponds to the half precharge voltage VBLR such as VDL/2 after the sub word line SWL was selected so that the read voltage difference appears at the sense nodes SAT and SAB of the sense amplifier. When the potential difference between the sense nodes SAT and SAB is enlarged by the amplifying operation of the sense amplifier, the potential on the bit line BLLT on the high level side is raised by the switch MOSFET Q1 which is made to have a relatively low gate potential and which is connected with the bit line BLT on the high level side, thereby to enlarge the potential difference between the sense nodes SAT and SAB.

When these P-channel MOSFETs are used as the shared select MOSFETs to increase the signal amount on their high level side, it is desirable to set the precharge potential of the data input/output lines to the earth potential side and to cause the CMOS latch circuit constructing the main amplifier to perform the amplifying operation by the P-channel MOSFETs. When the main amplifier of FIG. 5 is used, more specifically, the operating voltage such as VDL is fed to the source sides of the P-channel MOSFETs Q24 and Q25 by the P-channel MOSFETS, and the earth potential of the circuit is fed to the sources of the N-channel MOSFETs Q21 and Q22. As a result, the main amplifier can be operated in an excellent sensible region in response to the output signal from the sense amplifier.

Figure 15:
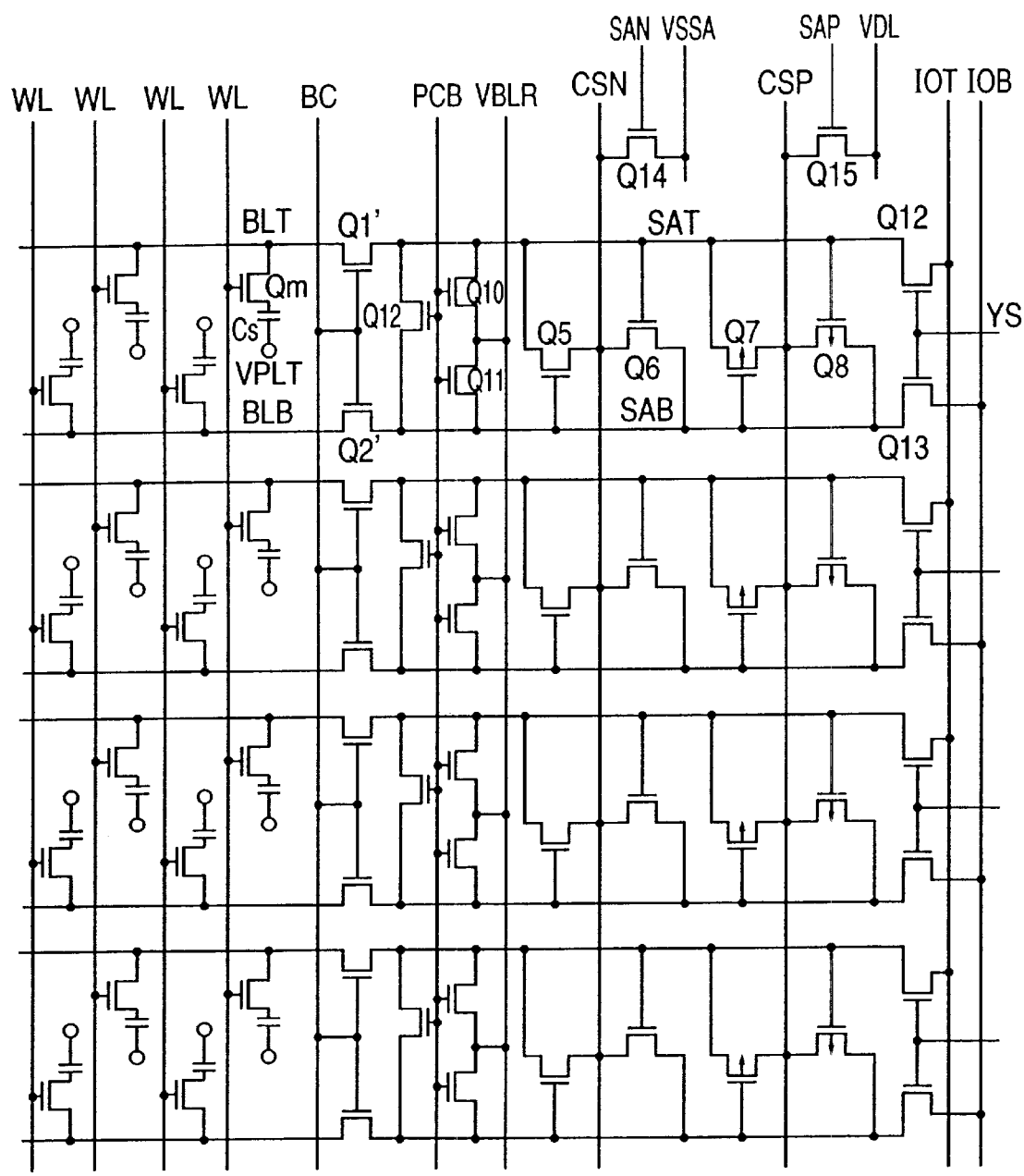
FIG. 15 is a circuit diagram showing the sense amplifier portion of another embodiment of the dynamic RAM according to the invention.

FIG. 15 is a circuit diagram showing the sense amplifier portion of another embodiment of the dynamic RAM according to the invention. This embodiment is exemplified by providing a pair of complementary bit lines in a manner to correspond to the sense amplifier. When the paired complementary bit lines BLT and BLB are thus assigned to the sense amplifier, too, bit line cutting MOSFETs Q1' and Q2' are interposed between the bit lines and the sense nodes SAT and SAB of the sense amplifier. Moreover, a control signal BC to be fed to the gates of those MOSFETs Q1' and Q2' is changed, unlike the-control of the ternary levels in the foregoing Japanese Patent Laid-Open No. 4-167293, with the binary voltage between a select level such as VPP and an intermediate potential such as VDL.

Even when these bit line cutting MOSFETs are provided, the sense output can be quickly read out to data input/output lines IOT and IOB by controlling the control signal BC not at the ternary level, as in the foregoing Laid-Open, but at the binary level, as has been described above. These data input/output lines IOT and IOB correspond, when the memory array is divided into sub arrays, as described above, to the local input/output lines and are connected by the selector circuit to the main input/output lines provided with the main amplifier.

Figure 16:
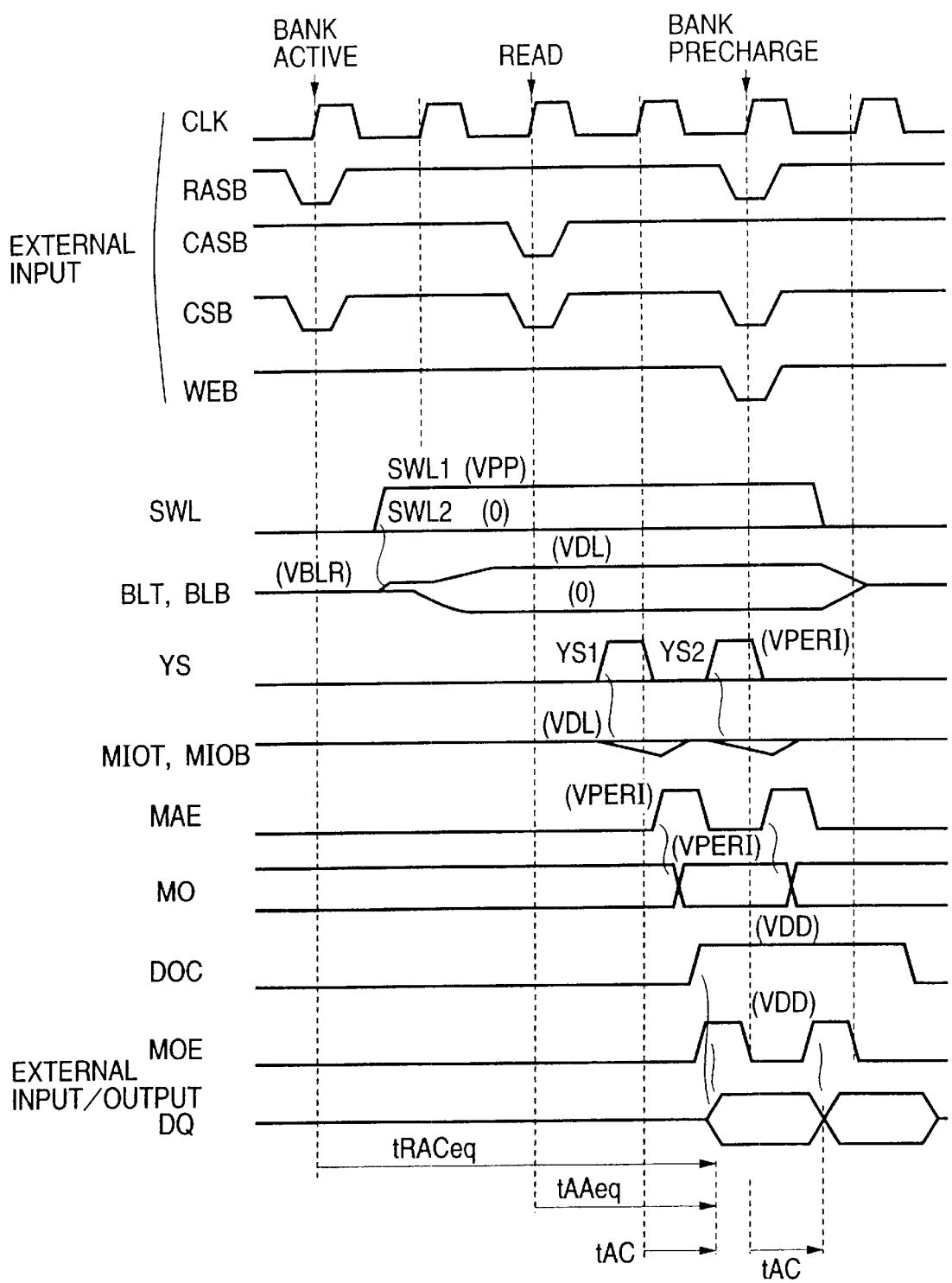
FIG. 16 is a waveform diagram for explaining the operations when the invention is applied to a synchronous DRAM.

FIG. 16 is a waveform diagram for explaining the operations when the invention is applied to a synchronous DRAM. FIG. 16 exemplifies the case of the burst length BL=2 and a CAS latency CL=2. These values BL=2 and CL=2 are set in the mode register. For BL=2, two column switches are read/written for two consecutive cycles, and for CL=2, the output data are outputted from the output terminal DQ two cycles after the read command.

In response to a bank active command, an address signal of the row system is fetched from the address input terminal and decoded to set the sub word line SWL to the select level such as VPP. As a result. minute read signals appear on the complementary bit lines BLT and BLB. Since the sense amplifier is activated with the operation timing signal, the minute read signals of the complementary bit lines BLT and BLB are amplified to a high level such as VDL and to a low level such as VSS so that the sub word line SWL is reloaded (or refreshed) in the selected memory cell. Then, at the start of the operation of the sense amplifier, the gate voltage of the shared switch MOSFETs on the not-shown selected side is temporarily set to the intermediate voltage, as described hereinbefore, and then returned to the select level so that a refresh operation is executed.

After two cycles of the bank active command, a read command is inputted so that an address signal of the column system not-shown is fetched to raise a column select signal YS1. As a result, the main input/output lines MIOT and MIOB are precharged to the VDL level just before the column selection, and the necessary read voltage difference is obtained from the bit line information of the YS selection and is amplified by the main amplifier, as activated with the signal MAE, to generate an output signal MO. This output signal MO of the main amplifier is a low amplitude signal corresponding to the dropped voltage VPER1, as described hereinbefore, and is shifted in its level to the VDD level at the input portion of the output buffer so that it is outputted in synchronism with the output timing signal DOC. For BL=2, the address of the Y system is switched in synchronism with the next clock CLK of the read command so that the output signal MO of the main amplifier is generated correspondingly.

The access time from the bank active command to the decision of the first output signal DQ is tRACeq; the access time from the read command to the decision of the output signal DQ is tAAeq; and the access time from the clock signal CLK to the decision of the output signal DQ is tAC. According to the invention, a necessary amount of read signal to the main amplifier is quickly achieved at the time of the Y selecting operation so that the access time tAC can be shortened. By the control with the high amplitude signal, moreover, the current to flow to the MOSFETs to be driven thereby can be increased to reduce the signal delay thereby to make a contribution to the higher speed. As a result, the period of the clock signal CLK can be accordingly shortened to raise the speed of the synchronous DRAM.

The following effects can be obtained from the foregoing embodiments. That is:

(1) Switch MOSFETs are interposed between a sense amplifier disposed in a dynamic RAM and complementary bit lines. After signal voltages were read out by the selecting operations of said word lines from a plurality of dynamic memory cells selected, to the plurality of pairs of complementary bit lines in, accordance with their individual storage informations, the switch control signal of said switch MOSFETs is changed from a select level to the intermediate potential having: (a) on OFF state or a relatively high ON resistance for the signal voltage read out to said complementary bit lines; (b) an ON state with a relatively low resistance for a potential at which the sense nodes are set to one level by the amplifying operation of the sense amplifier; and (c) an OFF state at a potential of the other level. The sense amplifier is supplied with an operating voltage to start the amplifying operation in response to the change in said switch control signal; an amplification signal generated by said amplifying operation is transmitted through the column select circuit to said input/output lines in response to the column select signal; and said switch control signal is returned to the select level in response to the selecting operation of said column select circuit. As a result, there is provided an effect that the sense amplifying operation of a minute signal can be performed stably and quickly, to output the amplified signal at a high speed to the data input/output lines.

(2) A precharge circuit for precharging said complementary bit lines is further provided at said sense nodes; and when said word lines are in an unselected state, said switch control signal is set to a select level so that the complementary bit lines are precharged through said switch MOSFETs by the precharge circuit disposed at the sense nodes. As a result, the sense amplifying operations of the minute signal can be performed stably and quickly, and the amplified signal can be outputted quickly to the data input/output lines. At the same time, the precharge circuit can be shared between the sense nodes and the complementary bit lines thereby to provide an effect that the circuit can be simplified.

(3) The complementary bit lines are arranged on the left and right of said sense nodes; said switch MOSFETs are used with select switch MOSFETs, of said complementary bit lines arranged on the left and right; and the switch control signal of the switch MOSFETS, corresponding to the unselected complementary bit line, is set to an unselect level before said word lines are selected. By using this shared sense construction, the sense amplifying operations of the minute signal can be performed stably and quickly, and the amplified signal can be outputted quickly to the data input/output lines thereby to provide an effect that the circuit can be simplified.

(4) Said switch control signal is returned in a gentle change from said intermediate potential to the select level in response to the selecting operation of said column select circuit. As a result, the signal voltage on the other level side can be enlarged to provide an effect that the sense amplifying operations of the minute signal can be performed stably and quickly to output the amplified signal more quickly to the data input/output lines.

(5) The main amplifier including the CMOS latch circuit having connected input/output terminals is connected with said data input/output lines; said data input/output lines are precharged to the other level of a polarity reversed from that of one level of said sense nodes; and said main amplifier feeds, when it is brought into the operating state, said CMOS latch circuit with an operating voltage corresponding to the other potential. As a result, there is provided an effect that the main amplifier made of the CMOS latch circuit can be operated with a high sensitivity.

(6) Said word lines include a main word line and a plurality of sub word lines assigned commonly to said main word line; the gates of the address select MOSFETs of said dynamic memory cells are connected with said sub word lines; one of said sub word lines is selected by a sub word driver which receives the signal of said main word line and the signals of said sub word selecting lines; said sub word driver generates a select signal of the sub word lines which are disposed on the left and right sides excepting the end portions of the memory cell array; and said sense amplifier senses the amplified signals from the complementary bit lines which are disposed on the left and right sides, except for the end portions of the memory cell array. As a result, there is provided an effect that a dynamic RAM having a large storage capacity can be realized to stabilize the sense amplifying operation of the minute signal and to output the amplified signal with a high speed to the data input/output lines.

(7) The operating voltage to be fed to said sense amplifier is a dropped voltage which is dropped from the power voltage fed from an external terminal; the select level of said word lines and the select level of said switch MOSFETs are a boosted voltage which is boosted from said power voltage; and said intermediate potential uses the dropped voltage corresponding to the operating voltage of said sense amplifier. As a result, there is provided an effect that the sense amplifying operation of the minute signal can be stabilized and quickened without any addition of a special internal power circuit, thereby to output the amplified signal to the data input/output lines at a high speed.

Although our invention has been specifically described in connection with various exemplary embodiments, it should not be limited to those embodiments but can naturally be modified in various manners without departing from the gist thereof. In the dynamic RAM shown in FIG. 1 or 2, for example, the construction of the memory array, the sub array and the sub word driver can take a variety of modifications, as exemplified by a word shunt construction using no sub word driver. The power switch MOSFET Q15 for applying the operating voltage VDL to the sense amplifier may be exemplified by a P-channel MOSFET.

The operating voltage of the sense amplifier may use the power voltage fed from the external terminal, as it is. The intermediate voltage of this case may use a half precharge voltage or may utilize a voltage generated especially therefor. The main amplifier may utilize a differential amplifier in addition to the one using the CMOS latch circuit. The invention can be widely utilized in a semiconductor memory device using the dynamic memory cells, such as the semiconductor memory device to be packaged over a digital integrated circuit such as a microcomputer.

The effects to be obtained by the representative aspects of the invention disclosed herein will be briefly described in the following. Specifically, switch MOSFETs are interposed between a sense amplifier disposed in a dynamic RAM and complementary bit lines. After signal voltages were read out by the selecting operations of said word lines from a plurality of dynamic memory cells selected, to the plurality of pairs of complementary bit lines in accordance with their individual storage informations, the switch control signal of said switch MOSFETs is changed from a select level to the intermediate potential having: (a) an OFF state or a relatively high ON resistance for the signal voltage read out to said complementary bit lines; (b) an ON state with a relatively low ON resistance for a potential at which the sense nodes are set to one level by the amplifying operation of the sense amplifier; and an OFF state at a potential of the other level; said sense amplifier is fed with an operating voltage to start the amplifying operation in response to the change in said switch control signal; an amplification signal generated by said amplifying operation is transmitted through the column select circuit to said input/output lines in response to the column select signal; and said switch control signal is returned to the select level in response to the selecting operation of said column select circuit. As a result, the sense amplifying operation of a minute signal can be performed stably and quickly, and the amplified signal can be outputted at a high speed to the data input/output lines.

We claim:

1. A semiconductor memory comprising:

a plurality of word lines;

a pair of complementary bit lines;

a plurality of memory cells connected to said plurality of word lines, respectively;

a sense amplifier which amplifies a pair of signals appearing on said pair of complementary bit lines; and a pair of N-channel MOSFETs interposed between a pair of sense nodes of said sense amplifier and said pair of complementary bit lines, which MOSFETs receive a control signal at their gates, wherein said control signal is selectively set to one of a high level, a low level and an intermediate level between said high level and said low level, wherein, after said pair of signals have appeared on said pair of complementary bit lines by selecting one of said plurality of word lines, said control signal is changed from said high level to said intermediate level, and wherein, after the start of the operation of said sense amplifier, said control signal is returned from said intermediate level to said high level.

2. A semiconductor memory comprising:

a plurality of word lines;

a pair of complementary bit lines;

a plurality of dynamic memory cells connected to said plurality of word lines, respectively;

a sense amplifier which amplifies a pair of signals appearing on said pair of complementary bit lines; and a pair of MOSFETs interposed between a pair of sense nodes of said sense amplifier and said pair of complementary bit lines, which MOSFETs receive a control signal at their gates, wherein said control signal is selectively set to one of a select level, an unselect level and an intermediate level between said select level and said unselect level, wherein, after said pair of signals have appeared on said pair of complementary bit lines by selecting one of said plurality of word lines, said control signal is changed from said select level to said intermediate level, and wherein, after the start of the operation of said sense amplifier, said control signal is returned from said intermediate level to said select level.

3. A semiconductor memory comprising:

a pair of complementary bit lines;

a plurality of word lines crossing said pair of complementary bit lines;

a plurality of dynamic memory cells each of which is connected to a corresponding one of said plurality of word lines and a corresponding one of said pair of data lines;

a sense amplifier which amplifies a pair of signals appearing on said pair of complementary bit lines; and a pair of MOSFETs interposed between a pair of sense nodes of said sense amplifier and said pair of complementary bit lines, which MOSFETs receive a control signal at their gates, wherein said control signal is selectively set to one of a select level, an unselect level and an intermediate level between said select level and said unselect level, wherein, after said pair of signals have appeared on said pair of complementary bit lines by selecting one of said plurality of word lines, said control signal is changed from said select level to said intermediate level, wherein, after the start of the operation of said sense amplifier, said control signal is returned from said intermediate level to said select level, and wherein said control signal is set to said unselect level when each of said plurality of word lines is supposed to be unselected.

4. A semiconductor memory comprising:

a pair of complementary bit lines;

a plurality of word lines crossing said pair of complementary bit lines;

a plurality of dynamic memory cells each of which is connected to a corresponding one of said plurality of word lines and a corresponding one of said pair of data lines;

a sense amplifier which amplifies a pair of signals appearing on said pair of complementary bit lines; and a pair of N-channel MOSFETs interposed between a pair of sense nodes of said sense amplifier and said pair of complementary bit lines, which MOSFETs receive a control signal at their gates, wherein said control signal is selectively set to one of a high level, a low level and an intermediate level between said high level and said low level, wherein, after said pair of signals have appeared on said pair of complementary bit lines by selecting one of said plurality of word lines, said control signal is changed from said high level to said intermediate level, wherein, after the start of the operation of said sense amplifier, said control signal is returned from said intermediate level to said high level, and wherein said control signal is set to said low level when each of said plurality of word lines is supposed to be unselected.

5. A semiconductor memory according to claim 4, wherein said sense amplifier provides said pair of sense nodes with a high side voltage corresponding to said intermediate level and a low side voltage corresponding to said low level.

* * * * *